(12) United States Patent
Ortner et al.

(10) Patent No.: US 10,802,404 B2
(45) Date of Patent: Oct. 13, 2020

(54) RETICLE AND EXPOSURE METHOD INCLUDING PROJECTION OF A RETICLE PATTERN INTO NEIGHBORING EXPOSURE FIELDS

(71) Applicant: Infineon Technologies AG, Neubiberg (DE)

(72) Inventors: Joerg Ortner, Drobollach (AT); Iris Moder, Villach (AT); Ingo Muri, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 233 days.

(21) Appl. No.: 15/919,989

(22) Filed: Mar. 13, 2018

(65) Prior Publication Data
US 2018/0267408 A1    Sep. 20, 2018

(30) Foreign Application Priority Data

Mar. 14, 2017 (DE) .................. 10 2017 105 402

(51) Int. Cl.
*G03F 7/20* (2006.01)
*G03F 1/00* (2012.01)
*G03F 1/42* (2012.01)

(52) U.S. Cl.
CPC .............. *G03F 7/203* (2013.01); *G03F 1/00* (2013.01); *G03F 1/42* (2013.01)

(58) Field of Classification Search
CPC .............. G03F 1/00; G03F 1/42; G03F 7/203

USPC ................................. 430/5, 22, 30
See application file for complete search history.

(56) References Cited

U.S. PATENT DOCUMENTS

| 5,286,584 | A | 2/1994 | Gemmink et al. |
| 6,051,344 | A | 4/2000 | Langston et al. |
| 6,194,102 | B1 | 2/2001 | Nakasuji et al. |
| RE38,798 | E * | 9/2005 | Nishi .................. G03F 7/70358 355/50 |
| 7,388,653 | B2 * | 6/2008 | Kim .................... G03F 7/70475 355/53 |
| 7,588,869 | B2 * | 9/2009 | Lee ..................... G03F 7/70433 430/22 |

OTHER PUBLICATIONS

Flack, Warren et al., "Large Area Interposer Lithography", Ultratech, Inc., IEEE 64th Electronic Components & Technology Conference, May 27-30, 2014, 7 pages.

* cited by examiner

*Primary Examiner* — Christopher G Young
(74) *Attorney, Agent, or Firm* — Slater Matsil, LLP

(57) ABSTRACT

An exposure method includes projecting a reticle pattern into a first exposure field of a photoresist layer, wherein the reticle pattern includes first and second line patterns on opposite edges of the reticle pattern and wherein at least the first line pattern includes an end section through which light flux decreases outwards. The reticle pattern is further projected into a second exposure field of the photoresist layer, wherein a first tapering projection zone of the end section of the first line pattern in the second exposure field overlaps a projection area of the second line pattern in the first exposure field.

11 Claims, 19 Drawing Sheets

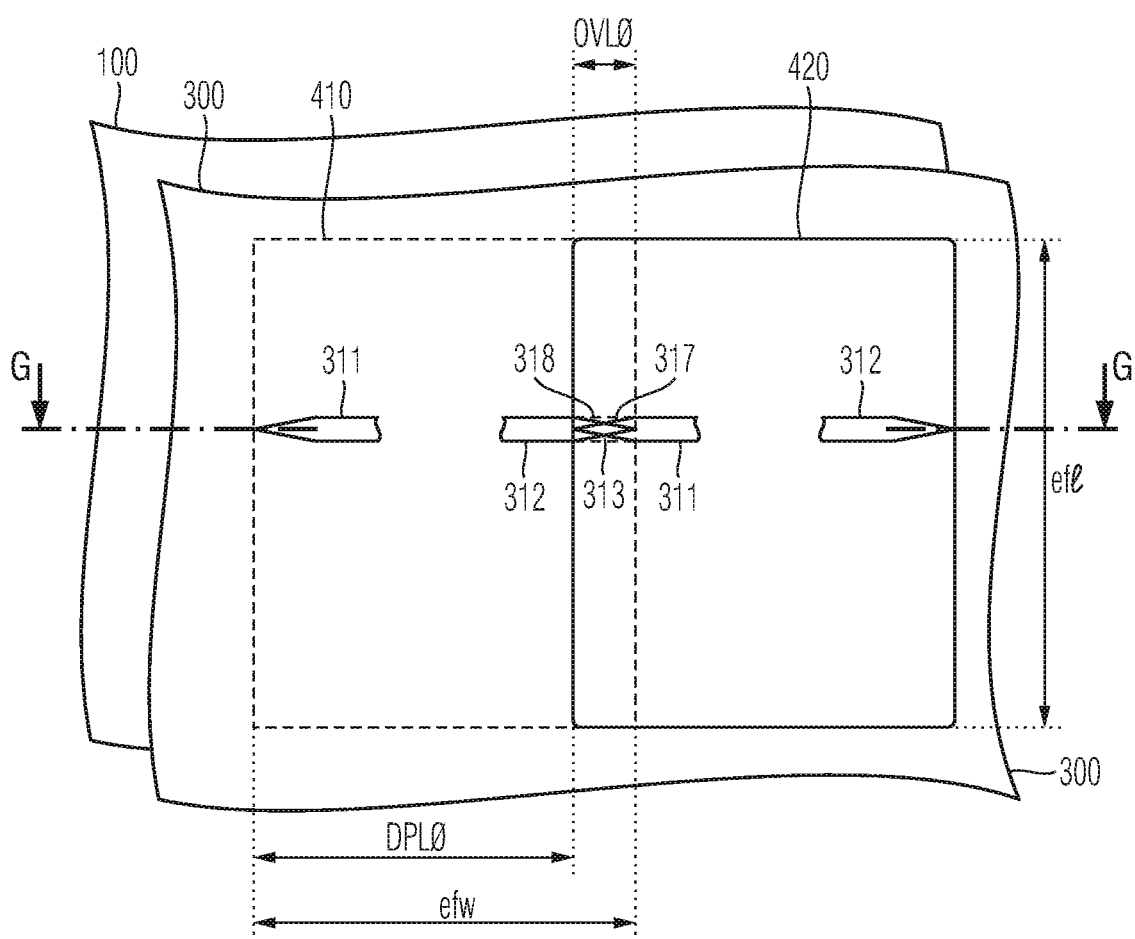

RETICLE AND EXPOSURE METHOD INCLUDING PROJECTION OF A RETICLE PATTERN INTO NEIGHBORING EXPOSURE FIELDS

This application claims the benefit of German Application No. 102017105402.2, filed on Mar. 14, 2017, which application is hereby incorporated herein by reference in its entirety.

TECHNICAL FIELD

The present invention relates generally to a system and method of semiconductor processing, and, in particular embodiments, to a reticle and exposure method including projection of a reticle pattern in to neighboring exposure fields.

BACKGROUND

Photolithography transfers patterns formed on a reticle into exposure fields of a photoresist layer containing a photoactive compound and coating a substrate, wherein the reticle pattern spatially modulates light of an exposure wavelength. In exposed sections of the photoresist layer the exposure light breaks chemical bonds in the photoactive compound such that exposed and shadowed sections of the photoresist layer form a latent image of the reticle pattern. A developer may selectively remove the exposed sections with respect to the unexposed sections or vice versa. A wafer stage may move the substrate along two orthogonal horizontal directions with respect to the exposure beam in steps such that the exposure fields of successive exposures form a pattern of rows and columns on the substrate. Shortcomings of the wafer stage may induce a displacement error between neighboring exposure fields within a given stepping accuracy. Typically, the reticle pattern includes patterns for one or more complete functional semiconductor devices such that a certain misalignment between neighboring exposure fields is acceptable. But where a pattern feature crosses the boundary of an exposure field, the tolerable misalignment between neighboring exposure fields depends on feature size and function of the concerned feature. Improving stepping accuracy of the exposure apparatus typically increases complexity of the exposure apparatus.

There is a need for improving imaging of pattern features that cross exposure field boundaries.

SUMMARY

The present disclosure concerns an exposure method. A reticle pattern is projected into a first exposure field of a photoresist layer, wherein the reticle pattern includes first and second line patterns on opposite edges of the reticle pattern and wherein at least the first line pattern includes an end section through which light flux decreases outwards. The reticle pattern is further projected into a second exposure field of the photoresist layer, wherein a first tapering projection zone of the end section of the first line pattern in the second exposure field overlaps a projection area of the second line pattern in the first exposure field.

The present disclosure further relates to a reticle that includes a reticle pattern in a pattern area. The reticle pattern includes a first line pattern including an end section at an edge of the reticle pattern, wherein in the end section light flux through the first line pattern decreases with increasing distance to a horizontal center axis of the reticle pattern. The reticle pattern further includes a second line pattern, wherein a reflection of the end section of the first line pattern at the horizontal center axis overlaps the second line pattern.

The present disclosure also relates to a reticle set that includes a first reticle and a second reticle. The first reticle includes a first pattern section of a reticle pattern, wherein the first pattern section includes a first line pattern that includes an end section at an edge of the first pattern section. Light flux through the end section decreases with increasing distance to a horizontal center axis of the first pattern section. The second reticle includes a second pattern section of the reticle pattern, wherein the second pattern section includes a second line pattern. A reflection of the end section of the first line pattern at the horizontal center axis of the first pattern section overlaps a position-invariant translation of the second line pattern into the first pattern section.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 3C is a schematic plan view of a photoresist layer after exposure with the reticle of FIG. 3A;

DETAILED DESCRIPTION OF ILLUSTRATIVE EMBODIMENTS

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Figure 1:
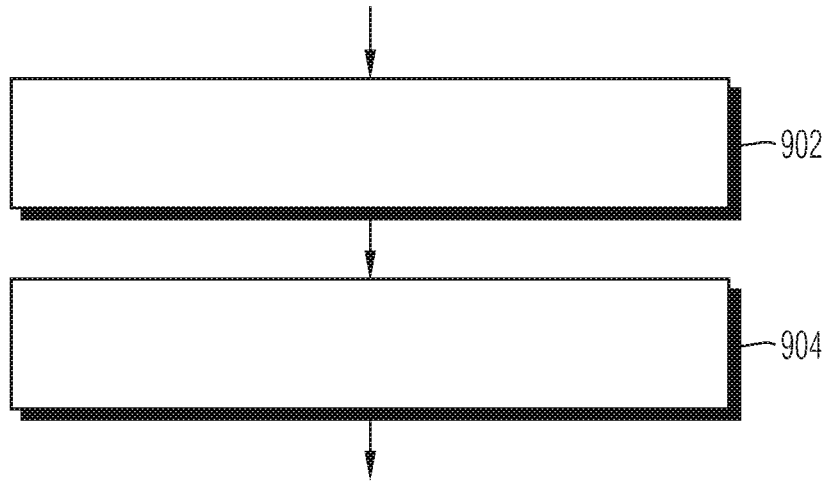
FIG. 1 is a simplified flowchart of an exposure method according to an embodiment, wherein line patterns with end sections, through which light flux through the line patterns decreases outwards, are imaged into neighboring exposure fields of a photoresist layer, and wherein two projection areas in neighboring exposure fields form one continuous stripe of nearly uniform width.

FIG. 1 is a flow chart summarizing an exposure method for forming cross-exposure field patterns according to an embodiment. An exposure apparatus images a reticle pattern, which is formed on a reticle, into neighboring exposure fields on a substrate that is covered with a photosensitive coating. The exposure apparatus may be a stepper providing a relative movement between the substrate and the exposure beam along one of two orthogonal horizontal axes between two successive exposures. The substrate may be a semiconductor substrate such as a silicon wafer, by way of example. The photosensitive coating may be a photoresist layer containing a PAC (photoactive compound), wherein sections of the photoresist layer exposed to the exposure beam become more soluble or less soluble to a photoresist developer than unexposed sections of the photoresist layer.

According to an embodiment the photoresist layer contains a positive resist in which the exposed sections become more soluble to a photoresist developer containing an aqueous base. The exposure radiation may contain broadband radiation or lines of wavelength of 365 nm, 248 nm or 193 nm, by way of example.

The reticle pattern includes at least a pair of line patterns on opposite sides. The first and second line patterns may be isolated stripes, may be sections of a single continuous stripe or may be sections of a complex pattern. In a rectangular reticle pattern the first and second line patterns are on opposite first edges of the reticle pattern.

The first and second line patterns are arranged such that a reflection of the first line pattern at a horizontal center axis of the reticle pattern as axis of symmetry overlaps the second line pattern at least partly along a direction parallel to the horizontal center axis, wherein the horizontal center axis runs in the center of the reticle pattern at equal distances to the two first edges at which the first and second line patterns are formed and wherein the first and second line patterns may include line sections of equal width or of different width.

The first and second line patterns may be shifted to each other along a direction parallel to the horizontal center axis, wherein the displacement is small enough for that a reflection of the first line pattern at the horizontal center axis still overlaps the second line pattern to some degree, e.g., by at least 50% or at least 20% of a line pattern width of the narrower one of the first and second line patterns.

According to another embodiment the line patterns may be positioned symmetrically with respect to the horizontal center axis parallel to the first edges of the reticle pattern, i.e., may have the same distance to the horizontal center axis and may have the same distance to a second edge orthogonal to the first edges.

In the following, the term "matching line patterns" stands for a pair of first and second line patterns, for which a reflection of the first line pattern at a horizontal center axis overlaps the second line pattern along a direction parallel to the horizontal center axis.

At least the first line pattern includes an end section or both the first and second line patterns include end sections extending outwardly, wherein the end sections control light flux, i.e., a total amount of light or exposure dose per length unit of the first and second line patterns to decrease with increasing distance to that horizontal center axis of the reticle, which runs between the two line patterns.

The first and second line patterns may be transparent line patterns, wherein the exposure light passes through the first and second line patterns. The amount of light or light flux through the end sections may be reduced by narrowing the stripe width of the transparent line patterns, by reduction of the transparency of the line patterns for the exposure light, or by a combination of both.

Alternatively, the first and second line patterns may be opaque or grey tone line patterns, wherein the effective light dose passes through transparent areas on the long sides of the opaque line patterns. Light flux through the transparent areas on the long sides may be reduced by widening the stripe width of the opaque line patterns, by reducing the transparency of the transparent areas on the long sides, or by a combination of both.

The reticle pattern is projected into a first exposure field of the photoresist layer (902). Then the exposure apparatus moves either the semiconductor substrate with respect to the exposure beam or the exposure beam with respect to the semiconductor substrate, or both, and projects the reticle pattern into a second exposure field (904), wherein the first and second exposure fields overlap in a way that in the photoresist layer a tapering projection zone of the end section of the first line pattern in the second exposure field overlaps a projection of the second line pattern in the first exposure field, e.g., a tapering projection zone of the end section of the second line pattern in the first exposure field.

A cross-exposure field structure can be formed that includes a first section exclusively resulting from the first exposure into the first exposure field, a second section exclusively resulting from the second exposure into the second exposure field, and an overlap section resulting from both the first and the second exposure and connecting the first and second sections.

Dimensions of the end sections and a nominal overlap between the first and second exposure fields are selected such that (i) the projections of the end sections overlap irrespective of an actual misalignment between the two exposure fields provided that the actual misalignment is within the limits of a stepping accuracy TOLW, which is specified for the exposure apparatus for a displacement between two neighboring exposure fields and (ii) within the specified stepping accuracy TOLW a degree of overexposure or underexposure in the overlap section is within a range that results in a relative deviation of a line width of a developed resist fin of at most ±50%, e.g., at most ±20% of a maximum width of the developed resist fin.

The method simplifies the formation of patterns crossing the boundary between two neighboring exposure fields, wherein the end sections allow a comparatively large misalignment between the two exposure fields both in two opposite horizontal directions along the longitudinal axis of the line patterns and in two opposite horizontal directions orthogonal to the longitudinal axis of the line patterns.

In case a misalignment between the two exposure fields results in that an overlap of the two exposure fields is greater than the preset nominal overlap, the decreasing exposure dose in the end sections avoids or at least partially counteracts a local widening of the exposed stripe structure that would appear without the end sections.

In case a misalignment results in that the exposure fields have a smaller overlap than the nominal overlap, the end sections still provide sufficient overlap of the tapering projection zones such that the remaining overlap avoids a gap in the exposed stripe structure or an undue narrowing in the exposed stripe structure.

The method allows a comparatively large maximum misalignment between two neighboring exposure fields and facilitates the use of exposure apparatuses such as steppers with comparatively large stepping accuracy TOLW, which may be in the range of several ten nanometers, for the formation of cross-exposure field structures with a width of less than 200 nm.

Figure 2:
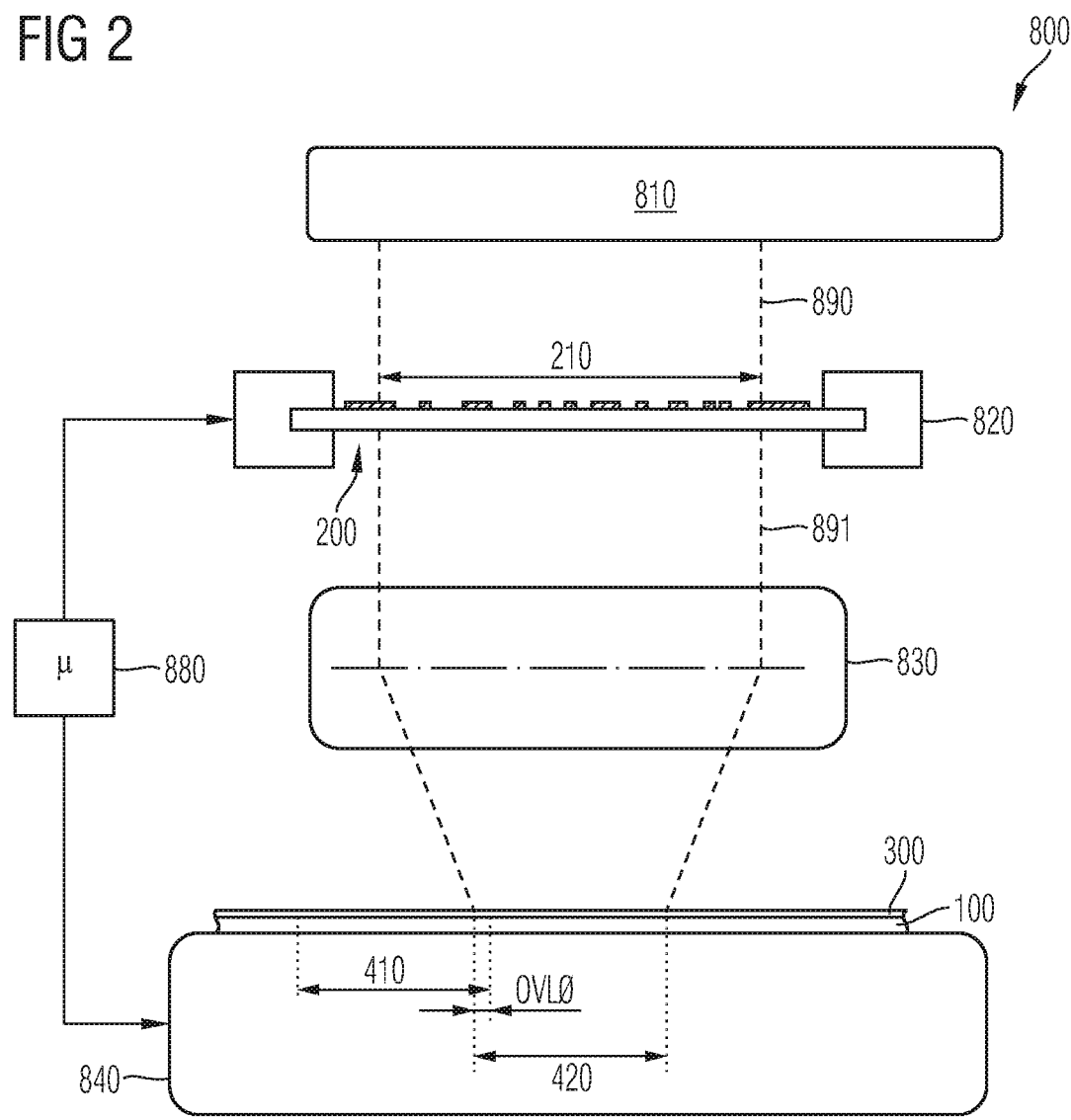
FIG. 2 is a schematic block diagram of an exposure apparatus for performing the exposure method of FIG. 1 according to an embodiment.

FIG. 2 refers to an exposure apparatus 800 usable for the method of FIG. 1, wherein the exposure apparatus 800 may be a wafer stepper or a wafer scanner transferring a reticle pattern 210 formed on a reticle 200 into a substrate 100 coated with a photoresist layer 300.

An illumination unit 810 contains a radiation source, e.g., a laser and illumination optics for generating and forming an exposure beam 890 and guiding the exposure beam 890 to the reticle 200. The reticle pattern 210 on the reticle 200 spatially modulates the exposure beam 890. The reticle 200 may be a reflective mask reflecting a spatially modulated exposure beam or a transmissive mask through which a spatially modulated exposure beam 891 passes.

The illumination unit 810 may illuminate the complete reticle pattern 210 in a single exposure shot or may include a scanning unit for a continuous scan of the reticle pattern 210. A reticle stage 820 holds and positions the reticle 200 during exposure.

A projection unit 830 guides the spatially modulated exposure beam 891 to a substrate 100, wherein the projection unit 830 sequentially projects the reticle pattern 210 into a plurality of exposure fields 410, 420 on the substrate 100 either at a same size or reduced in size at a ratio of, e.g., 4:1 or 5:1. A wafer stage 840 shifts the substrate 100 with respect to the reticle 200 after each exposure by about the width or length of the exposure fields 410, 420. The substrate 100 may be a semiconductor wafer.

A control unit 880 controls the wafer stage 840 or both the wafer stage 840 and the reticle stage 820 such that projections of line patterns in neighboring exposure fields 410, 420 overlap. A nominal overlap OVLo between two neighboring exposure fields 410, 420 may be set in a range from 40% to 60% of a stepping accuracy TOLW specified as stepping accuracy for a lateral misalignment of the exposure fields 410, 420 to each other.

FIGS. 3A to 3I illustrate an exposure method for forming cross-exposure field structures according to an embodiment referring to the formation of a cross-exposure field resist trench in a positive resist, wherein the resist trench may be defined by two transparent line patterns of a reticle pattern, which may be formed on one reticle or which may be split up on two different reticles.

Figure 3A:
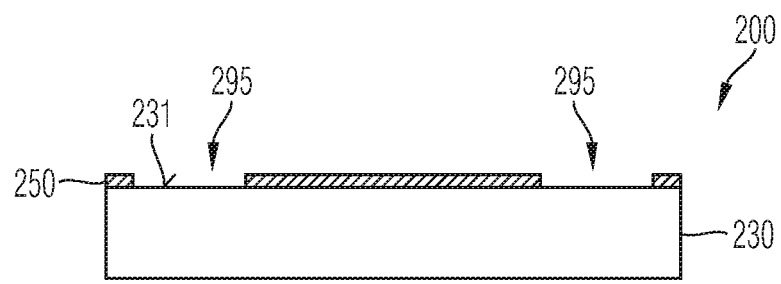
FIG. 3A is schematic vertical cross-sectional view of a reticle according to an embodiment concerning a reticle with transparent line patterns, wherein light flux through the transparent line patterns decreases with increasing distance to a planar center axis of the reticle.

FIG. 3A shows a reticle 200 that may include a transparent mask substrate 230 of, e.g., quartz or fused silica and an opaque mask layer 250 formed on a pattern surface 231 of the mask substrate 230. The mask layer 250 may contain chrome as main constituent. Mask openings 295 in the mask layer 250 expose sections of the pattern surface 231 and define a reticle pattern 210. According to other embodiment the reticle 200 may be a phase-shift mask.

Figure 3B:
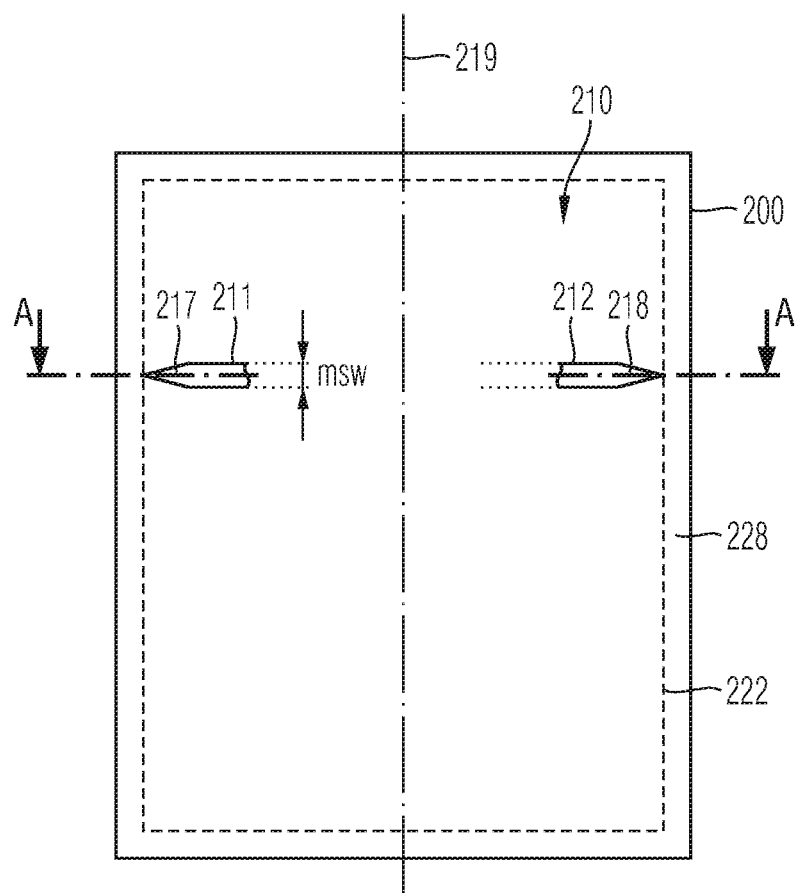
FIG. 3B is a schematic plan view of the reticle of FIG. 3A.

FIG. 3B shows a plan view of the reticle pattern 210 with a rectangular pattern area 222 in a central region of the reticle 200 and an exclusion zone 228 surrounding the pattern area 222. The reticle pattern 210 includes opaque sections and transparent sections exclusively or mainly in the pattern area 222. The pattern area 222 is the region in which the reticle 200 meets predefined mask specifications that concern imaging quality.

The transparent sections include at least a transparent first line pattern 211 and a transparent second line pattern 212 formed on opposite sides of the reticle pattern 210 and extending in a horizontal direction orthogonal to an edge of the reticle pattern 210. The first and second line patterns 211, 212 may have the same line pattern width msw or at least approximately the same line pattern width msw.

The first and second line patterns 211, 212 may be arranged such that a reflection of the first line pattern 211 at the horizontal center axis 219 at least partly overlaps the second line pattern 212 along the direction parallel to the horizontal center axis 219 such that they "match" in the sense as described above.

For example, the first and second line patterns 211, 212 may be arranged symmetrically with respect to the horizontal center axis 219, which runs orthogonal to the longitudinal axis of the first and second line patterns 211, 212.

The first and second line patterns 211, 212 may be isolated stripes, may be sections of one continuous, e.g., straight stripe or may be sections of a complex pattern. The first and second line patterns 211, 212 are on opposite sides of the reticle pattern 210 and may be completely formed within the pattern area 222 or may extend into the exclusion zone 228. The first and second line patterns 211 may be formed on the same reticle or on two different reticles.

The first and second line patterns 211, 212 include end sections 217, 218, in which light flux through the first and second line patterns 211, 212 decreases with increasing distance to the horizontal center axis 219. With decreasing light flux, an effective exposure dose per length unit decreases along the longitudinal axis of the first and second line patterns 211, 212. The effective exposure dose per length unit, i.e., the exposure dose of the modulated exposure beam 891 of FIG. 2 may be reduced by decreasing transparency of the first and second line patterns 211, 212, by decreasing the line pattern width msw or by a combination of both, wherein the effective exposure dose may be reduced in steps or continuously.

The end sections 217, 218 may differ as regards shape, length and width. According to embodiments the end sections 217, 218 may have the same dimensions and/or the same shape.

FIG. 3C shows a portion of a surface of a photoresist layer 300 coating a substrate 100 and including two exposure fields 410, 420 into which the reticle pattern 210 of FIG. 3B is transferred in successive exposures. A single exposure is also referred to as "exposure shot" in the following.

A first exposure shot projects the reticle pattern 210 into the first exposure field 410, wherein the first line pattern 211 of FIG. 3B is projected into a first projection area 311 and the second line pattern 212 of FIG. 3B is projected into a second projection area 312 of the photoresist layer 300. In the first and second projection areas 311, 312 the exposure light activates the PAC contained in the photoresist layer 300 to a degree such that in the first and second projection areas 311 the photoresist becomes soluble for a suitable developer. As a result of the first exposure shot, the first exposure field 410 includes a first latent image of the reticle pattern 210 of FIG. 3B.

Reticle 200 and substrate 100 are displaced relative to each other and a second exposure shot projects the reticle pattern 210 into a second exposure field 420 where a second latent image of the reticle pattern 210 of FIG. 3B is formed in the photoresist layer 300.

Where the first and second latent images overlap, the total effective exposure dose is the sum of the exposure doses from the first and the second exposure in the concerned area. Since a width of an area affected by the exposure is positively correlated with the total effective exposure dose in the concerned region, the second exposure activates the PAC also in an extension area 313 on opposite sides of overlapping sections of the first and second projection areas 311, 312.

A preset nominal displacement DPLo between the first and second exposure fields 410, 420 is typically set equal to an exposure field width efw parallel to the displacement direction reduced by a preset overlay OVLo. An actual displacement deviates from the preset nominal displacement DPLo by a current intrinsic deviation induced by an alignment process that adjusts the substrate 100 to the reticle 200 and to the exposure beam. The current intrinsic deviation may alter from exposure shot to exposure shot and is within a stepping accuracy TOLW specified for the used exposure apparatus. The stepping accuracy TOLW of a typical exposure apparatus may be ±50 nm or smaller, for example, ±20 nm.

The nominal displacement DPLo is selected such that the second exposure field 420 overlaps the first exposure field 410 by the nominal overlay OVLo. The nominal overlay OVLo and the dimensions of the end sections 217, 218 of the first and second line patterns 211, 212 of FIG. 3B are selected such that for any deviation from the nominal displacement DPLo within the stepping accuracy TOLW, a first tapering projection zone 317 of the end section 217 of the first line pattern 211 of FIG. 2B in the second exposure field 420 overlaps with a second tapering projection zone 318 of the end section 218 of the second line pattern 212 of FIG. 2B in the first exposure field 410.

As a result, for any displacement between the first and second exposure fields 410, 420 within the stepping accuracy TOLW, the first and second tapering projection zones 317, 318 of neighboring exposure fields 410, 420 partly overlap such that for positive and negative deviations within the stepping accuracy TOLW, the first and second projection areas 311, 312 in combination with the extension area 313 form a continuous latent stripe with a low width variation of at most ±50%, e.g., at most ±20% from a target stripe width.

Figure 3D:
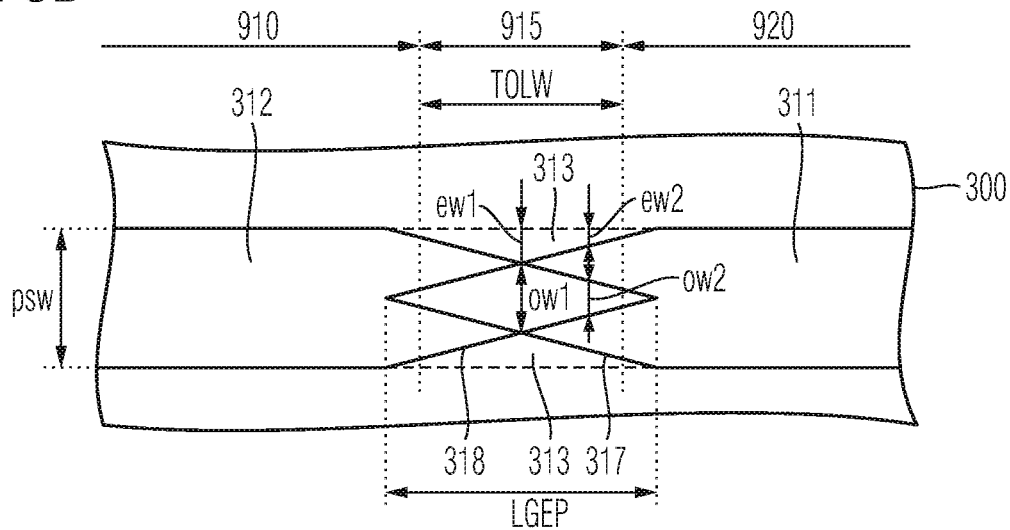
FIG. 3D shows an enlarged detail of FIG. 3C with overlapping projection areas of line patterns in neighboring exposure fields in case of perfectly aligned exposure fields.
Figure 3E:
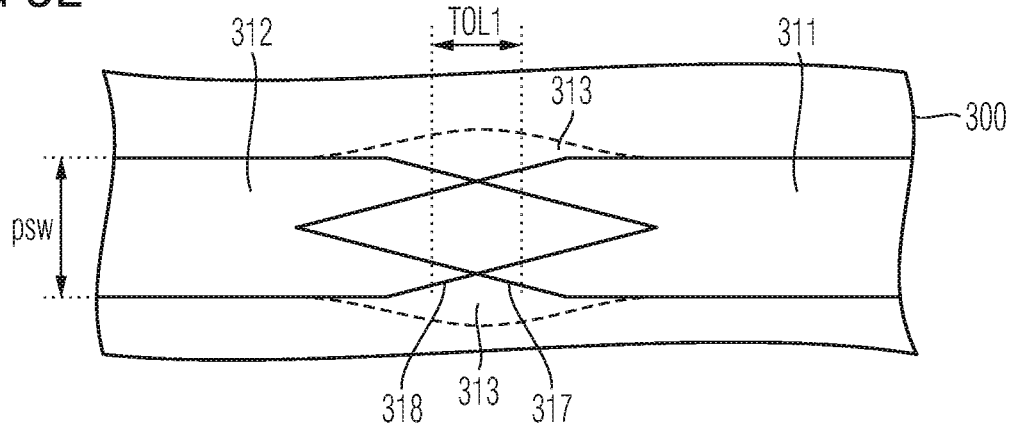
FIG. 3E shows an enlarged detail of FIG. 3C with overlapping projection areas of line patterns in neighboring exposure fields in case of a maximum displacement of the exposure fields in a direction away from each other.
Figure 3F:
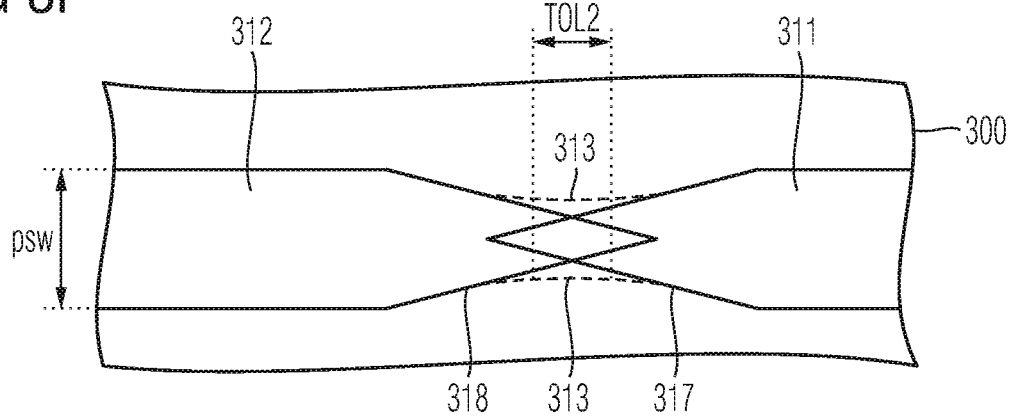
FIG. 3F shows an enlarged detail of FIG. 3C with overlapping projection areas of line patterns of neighboring exposure fields in case of a maximum displacement of the exposure fields in a direction towards each other.

FIGS. 3D to 3F refer to the setting of the dimensions of the first and second tapering projection zones 317, 318 and the nominal overlay OVLo with respect to the stepping accuracy TOLW between two neighboring exposure fields. A projection stripe width psw of straight portions of the first and second projection areas 311, 312 depends on the line pattern width msw of FIG. 3B and the imaging ratio of the projection unit and may be equal to the line pattern width msw, equal to 0.25*msw or equal to 0.2*msw, by way of example.

A length LGEP of the first and second tapering projection zones 317, 318 is selected to be in a range from 0.5*TOLW to 2*TOLW, e.g., from 0.7*TOLW to 1.5*TOLW.

In FIGS. 3D to 3F LGEP is set equal to 1.33*TOLW such that the first and second tapering projection zones 317, 318 are slightly longer than the width of the stepping accuracy. OVLo is set equal to LGEP such that for two perfectly aligned exposure fields 410, 420 the two tapering projection zones 317, 318 just completely overlap each other.

FIG. 3D shows the two overlapping tapering projection zones 317, 318 in case that the second exposure is carried out without deviation from the target position. The effective total exposure dose absorbed by the photoresist layer 300 per length unit in a stitched section 915, in which the tapering projection zones 317, 318 overlap, is approximately the same as in the straight sections 910, 920 outside the stitched section 915. In the stitched section 915 the positive correlation between exposure dose and stripe width results in extension areas 313 on both sides of the tapering portions, wherein the respective width ew1, ew2 of the extension areas 313 depends on the overlap width ow1, ow2 at the same position on the longitudinal axis of the first and second projection areas 311, 312. The photoactive compound is activated in both the first and second projection areas 311, 312 and the extension areas 313 and forms a latent image of a straight stripe with no or only low width variation from the projection stripe width psw.

FIG. 3E shows the two overlapping tapering projection zones 317, 318 in case that the second exposure is carried out with a maximum specified deviation TOL1 from the target position in direction of the first exposure field 410. The first and second projection areas 311, 312 overlap each other along at least the complete longitudinal extension of the tapering projection zones 317, 318 which also to some extend overlap with the straight portions of the first and second projection areas 311, 312. The extension areas 313 may to some degree overcompensate the reduced width of the first and second projection areas 311, 312 but a local widening of the latent stripe containing activated PAC is small compared to overlapping rectangular stripes without tapering end sections, e.g., at most +20% of the projection stripe width psw.

FIG. 3F shows two overlapping tapering projection zones 317, 318 in case that the second exposure is carried out with a maximum specified deviation TOL2 from the target position in direction opposite to the first exposure field. The tapering projection zones 317, 318 are still sufficiently close to each other such that in combination with the extension areas 313 the photoactive compound is activated in a continuous latent stripe with low width variation, e.g., at most −20% of the projection stripe width psw.

Figure 3G:
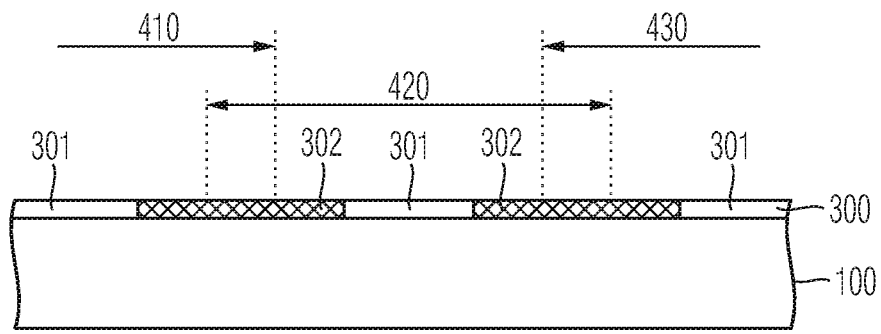
FIG. 3G is a schematic vertical cross-sectional view of the substrate covered with the exposed photoresist layer of FIG. 3C.

FIG. 3G shows the latent image formed by activated sections 302 and non-activated sections 301 of the photoresist layer 300 after a third exposure in a third exposure field 430. In the activated sections 302 the photoactive compound has been transformed from a first phase into a second phase, for example, from a unipolar organic molecule into a highly polar organic molecule, to a degree that the activated sections 302 show high solubility in polar solvents, for example, in a solution of aqueous base. The activated sections 302 include both the first and second projection areas 311, 312 directly exposed during one exposure and the extension areas 313 resulting from the double exposure in the overlap section.

Figure 3H:
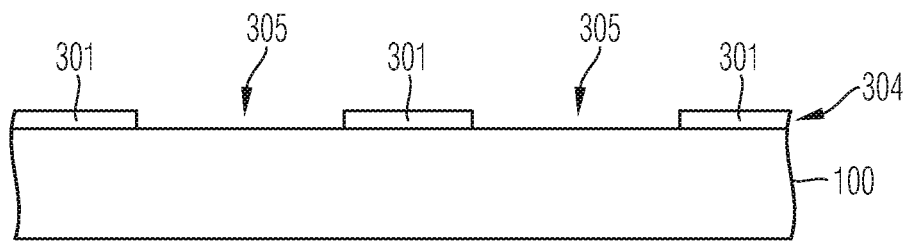
FIG. 3H is a schematic vertical cross-sectional view of the substrate covered with the exposed photoresist layer of FIG. 3G after developing.

FIG. 3H is a vertical cross-sectional view of the semiconductor substrate 100 after developing the exposed photoresist layer 300 of FIG. 3G.

The developer, for example, an aqueous base removes the activated sections 302 at high selectivity with respect to the unexposed, non-activated sections 301 of the photoresist layer 300 of FIG. 3G to form a patterned resist mask 304 with stripe-shaped resist openings 305.

Figure 3I:
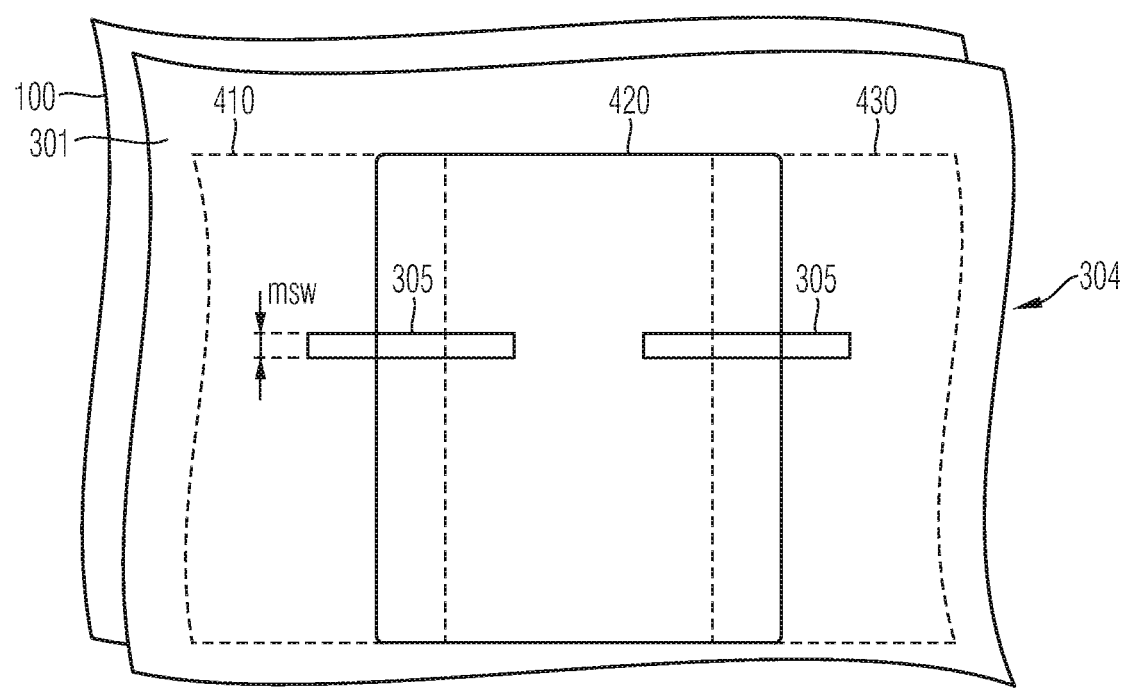
FIG. 3I is a schematic plan view of the substrate covered with the developed photoresist layer of FIG. 3H.

FIG. 3I shows a plan view of the patterned resist mask 304. The stripe-shaped resist openings 305 cross exposure field boundaries. Irrespective of an actual misalignment between the concerned first and second exposure fields 410, 420 within the stepping accuracy, a variation of a resist stripe width of each stripe-shaped resist opening 305 is at most ±50%, e.g., at most ±20% of the maximum resist stripe width of the stripe-shaped resist opening 305, provided that the actual misalignment is within the stepping accuracy. The resist mask 304 may be used as etch mask to form grooves in the substrate 100 or as an implant mask to form stripe-shaped doped regions in the substrate 100.

In case a negative resist is applied instead of a positive resist, the transparent line patterns result in resist stripes instead of resist openings.

Figure 4A:
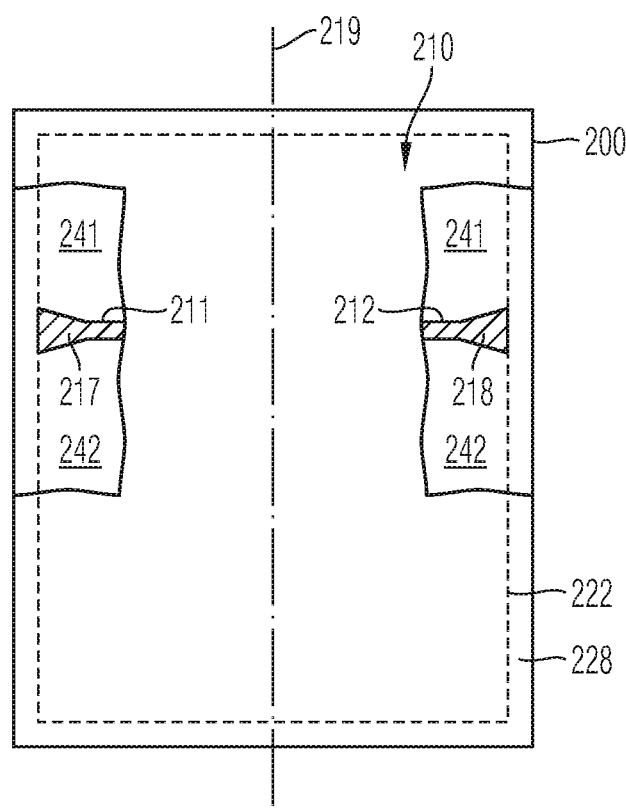
FIG. 4A is schematic plan view of a reticle according to an embodiment concerning a reticle that includes opaque line patterns, wherein light flux through transparent areas along long sides of the opaque line patterns decreases with increasing distance to a planar center axis of the reticle.
Figure 4B:
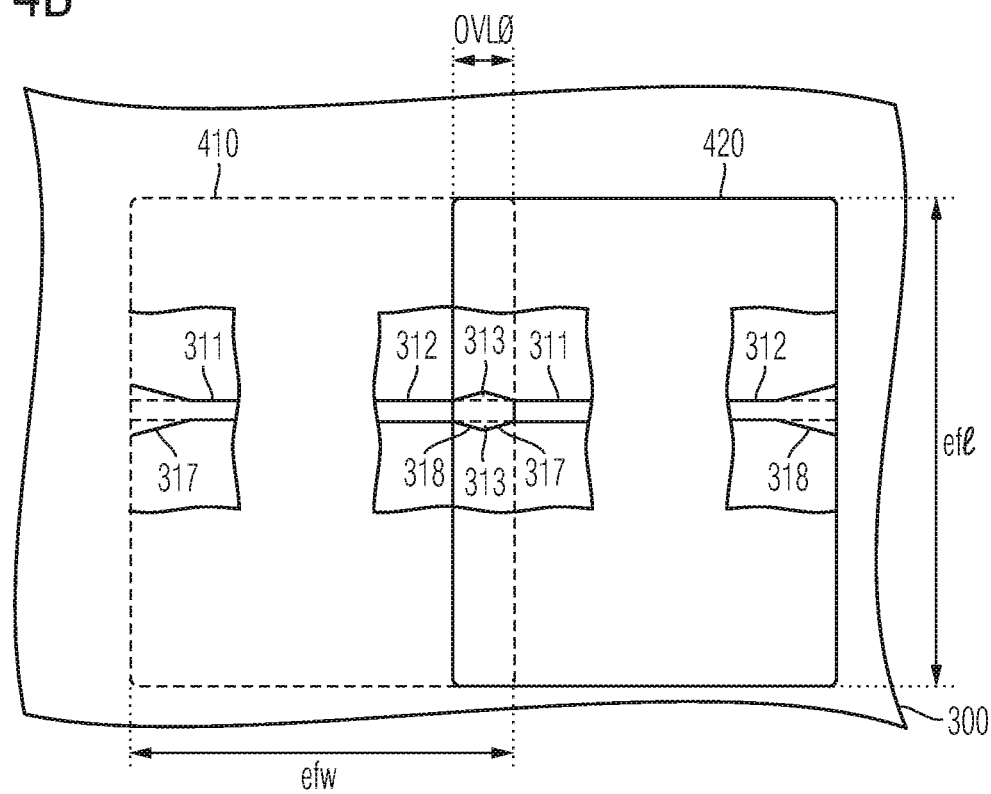
FIG. 4B is a schematic plan view of a photoresist layer after exposure with the reticle of FIG. 4A.
Figure 4C:
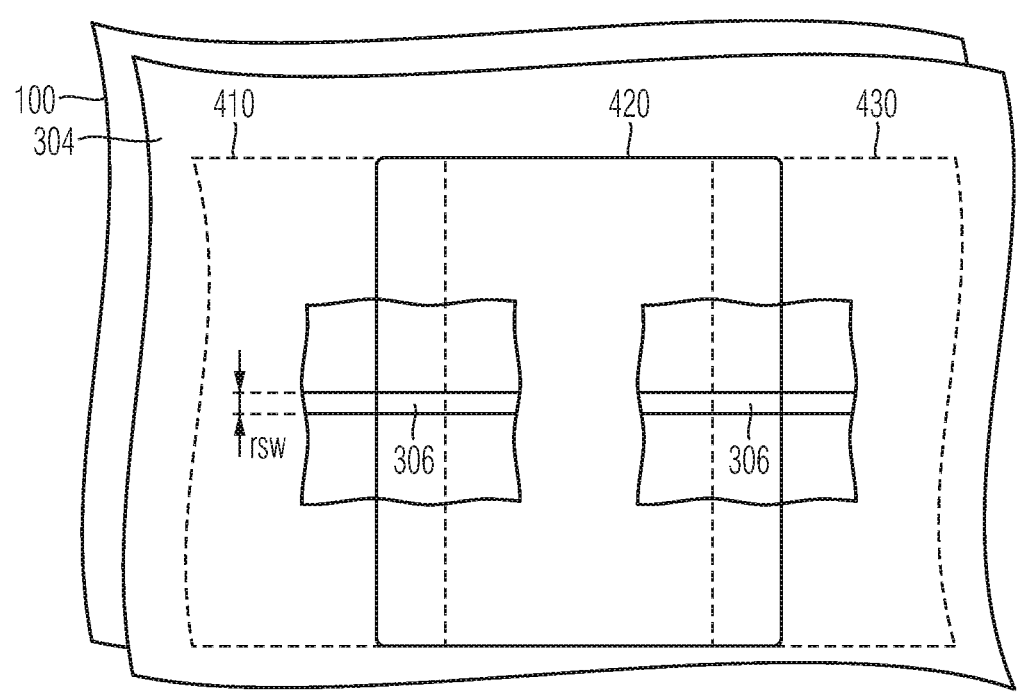
FIG. 4C is a schematic plan view of a substrate covered with the developed photoresist layer of FIG. 4B.

FIGS. 4A to 4C refer to an embodiment concerning formation of a cross-exposure field, stripe-shaped resist fin from a positive resist.

The reticle pattern 210 of a reticle 200 in FIG. 4A includes an opaque first line pattern 211 and an opaque second line pattern 212 formed on opposite sides of the reticle pattern 210 and extending in a horizontal direction orthogonal to an edge of the reticle pattern 210. The first and second line patterns 211, 212 may have the same line pattern width msw or at least approximately the same line pattern width msw and are arranged symmetrically with respect to a horizontal center axis 219 orthogonal to the longitudinal axis of the first and second line patterns 211, 212.

The first and second line patterns 211, 212 may be isolated stripes, may be sections of one continuous, e.g., straight stripe or may be sections of a complex pattern. Long sides of each of the opaque first and second line patterns 211, 212 directly adjoin transparent areas 241, 242.

The opaque first and second line patterns 211, 212 include end sections 217, 218, in which light flux through the transparent areas 241, 242 decreases with increasing distance to the horizontal center axis 219. In the transparent areas 241, 242 an effective exposure dose per length unit decreases parallel to the longitudinal axis of the opaque first and second line patterns 211, 212. The effective exposure dose per length unit may be reduced by decreasing transparency of the transparent areas 241, 242, by increasing the line pattern width msw of the opaque first and second line patterns 211, 212 or by a combination of both, wherein the effective exposure dose may be reduced in steps or continuously.

FIG. 4B shows the projection of the reticle pattern 210 of FIG. 4A into a first exposure field 410 and into the second exposure field 420 overlapping with the first exposure field 410.

A first exposure shot images the reticle pattern 210 into the first exposure field 410, wherein the opaque first line pattern 211 of FIG. 4A is imaged into a first projection area 311 and the opaque second line pattern 212 of FIG. 4A is projected into a second projection area 312 of the photoresist layer 300. Outside the first and second projection areas 311, 312 the exposure light activates the PAC contained in the photoresist layer 300 to a degree such that outside the first and second projection areas 311, 312 the photoresist becomes soluble for a suitable developer. Reticle and substrate 100 are displaced relative to each other and a second exposure shot projects and images the reticle pattern 210 into a second exposure field 420 where a second latent image of the reticle pattern 210 of FIG. 4A is formed in the photoresist layer 300.

Where the first and second latent images overlap, the second exposure activates the PAC also in an extension area 313 at opposite sides of overlapping sections of the first and second projection areas 311, 312.

The nominal overlay OVLo and the dimensions of the end sections 217, 218 of the opaque first and second line patterns 211, 212 in the reticle of FIG. 4A are selected such that for any deviation of the displacement within the stepping accuracy TOLW, a tapering projection zone 317 of the end section 217 of the opaque first line pattern 211 of FIG. 4A in the second exposure field 420 overlaps with a second tapering projection zone 318 of the end section 218 of the opaque second line pattern 212 of FIG. 4A in the first exposure field 410.

As a result, for any displacement between the first and second exposure fields 410, 420 within the stepping accuracy TOLW, the first and second tapering projection zones 317, 318 of the neighboring first and second exposure fields 410, 420 partly overlap such that for positive and negative deviations within the stepping accuracy TOLW, the extension area 313 modulates the first and second projection areas 311, 312 in a way that a continuous latent stripe with a low width variation of at most ±20% from a target stripe width is formed.

FIG. 4C shows a patterned resist mask 304 formed by developing the photoresist layer 300 of FIG. 4B. From the overlapping first and second projection areas 311, 312 and the extension area 313 a straight resist fin 306 is formed. The resist fin 306 may be used to form a cross-exposure field mesa structure in the substrate 100 underlying the resist mask 304. Across the complete longitudinal extension of the resist fin 306 a width variation of the resist fin 306 is at most ±50%, e.g., at most ±20% of the maximum resist stripe width rsw, irrespective of an actual misalignment between the exposure fields 410, 420, 430 provided that the actual misalignment is within the stepping accuracy.

Figure 5A:
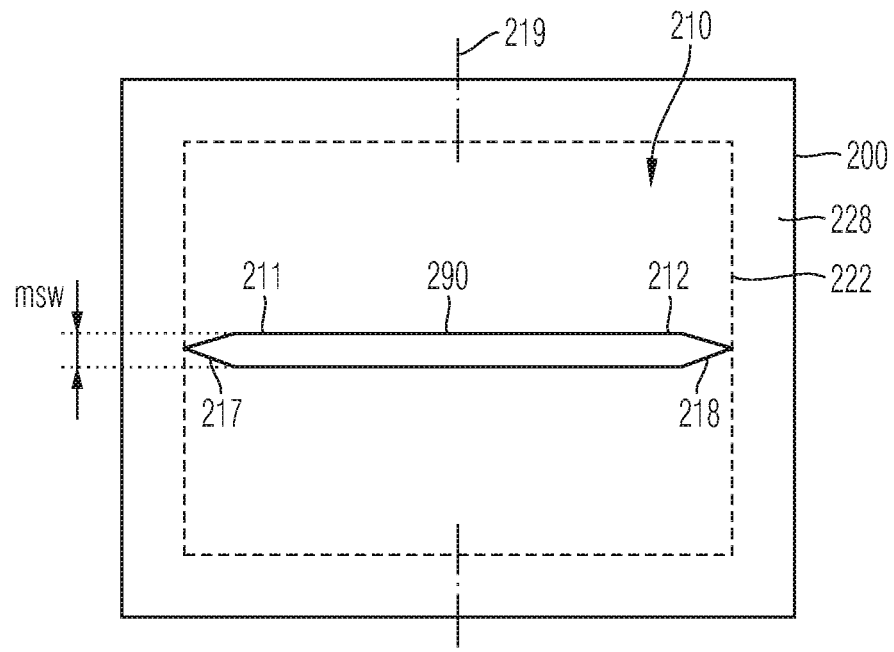
FIG. 5A is a schematic plan view of a reticle according to an embodiment referring to a continuous, straight stripe as cross-exposure field pattern.

In FIG. 5A a reticle 200 includes a central rectangular pattern area 222 and an exclusion zone 228 surrounding the pattern area 222, wherein the pattern area 222 is that part of the reticle 200 that fulfills predefined mask specifications. The reticle pattern 210 includes at least a continuous, transparent straight stripe 290 extending from one edge of the pattern area 222 to the opposite edge, wherein a line pattern width msw may be in a range from 50 nm to 2 µm, e.g., from 80 nm to 500 nm.

Sections on opposite ends of the transparent straight stripe 290 form the two opposite first and second line patterns 211, 212 including tapering end sections 217, 218 as described above. The tapering end sections 217, 218 may be completely formed within the pattern area 222 or may extend into the exclusion zone 228. The reticle pattern 210 may include one or more of the transparent straight stripe 290 as well as further transparent features.

Figure 5B:
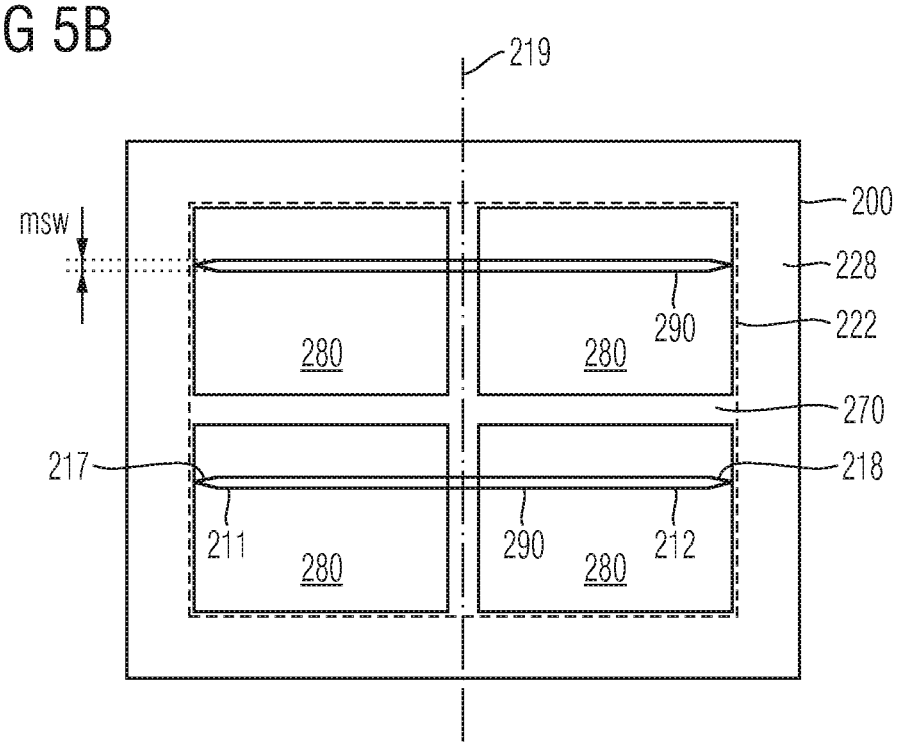
FIG. 5B is a schematic plan view of a reticle according to an embodiment combining device patterns with continuous, straight stripes as cross-exposure field pattern.

The reticle pattern 210 of the reticle 200 illustrated in FIG. 5B includes for identical chip patterns 280 within the pattern area 222, wherein each chip pattern 280 includes a complex pattern of transparent and opaque sections defining patterns and features within a chip area. A separation pattern 270 separates the chip patterns 280. The separation pattern may be completely transparent or completely opaque. In addition, the reticle pattern 210 includes at least one continuous, transparent straight stripe 290 extending from one side of the pattern area 222 to the other side thereby crossing the separation pattern 270 and two chip patterns 280.

Figure 5C:
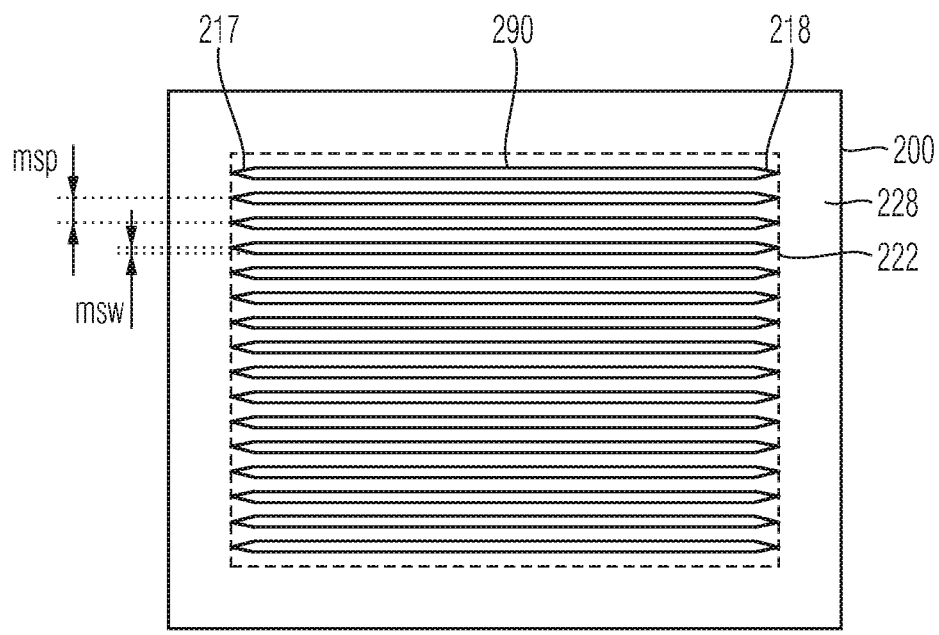
FIG. 5C is a schematic plan view of a reticle according to an embodiment referring to a regular cross-exposure field stripe pattern.

In FIG. 5C the reticle pattern 210 is a regular line pattern suitable, e.g., for forming cross-wafer structures for process control, e.g., as etch stop or for a grating test. The reticle pattern 210 may include a plurality of regularly spaced, continuous transparent straight stripes 290 that may have the same line pattern width msw and that are arranged at a same line pattern pitch msp equal to a center-to-center distance between neighboring transparent straight stripes 290, wherein the line pattern pitch may be two times the line pattern width msw or greater. The transparent straight stripes 290 include end sections 217, 218 as described above and may be exclusively formed in a pattern area 222 or may extend into the exclusion zone 228.

Figure 5D:
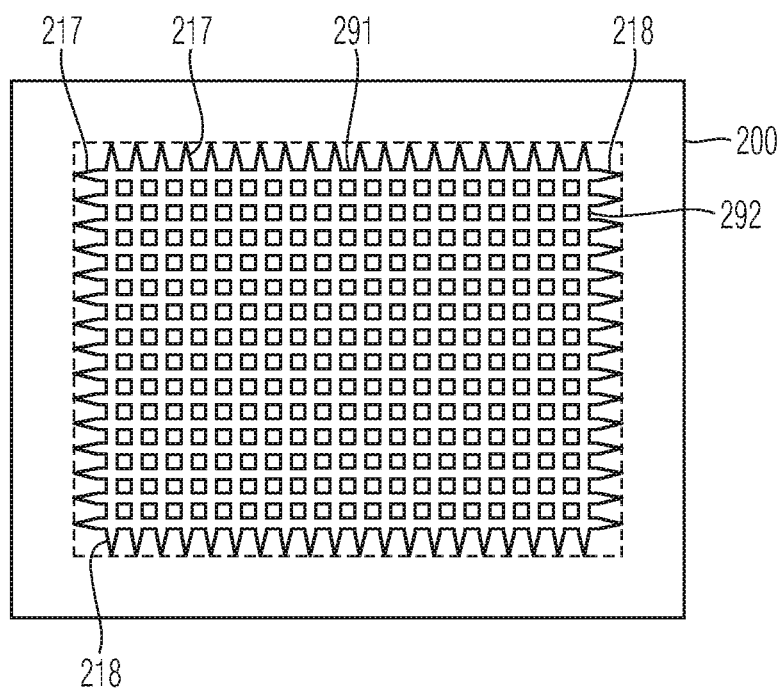
FIG. 5D is a schematic plan view of a reticle according to an embodiment referring to a regular cross-exposure field grid pattern.

In FIG. 5D the reticle pattern 210 is a regular grid pattern suitable, e.g., for a grating test. The reticle pattern 210 may include a plurality of regularly spaced, continuous straight first transparent stripes 291 that may have the same line pattern width msw and that are arranged at a same center-to-center distance msp as well as a plurality of regularly spaced, continuous straight second transparent stripes 292 that may have the same line pattern width msw and that are arranged at a same center-to-center distance msp, wherein the second transparent stripes 292 intersect the first transparent stripes, e.g., orthogonally. The first and second transparent straight stripes 290 include end sections 217, 218 as described above.

Figure 5E:
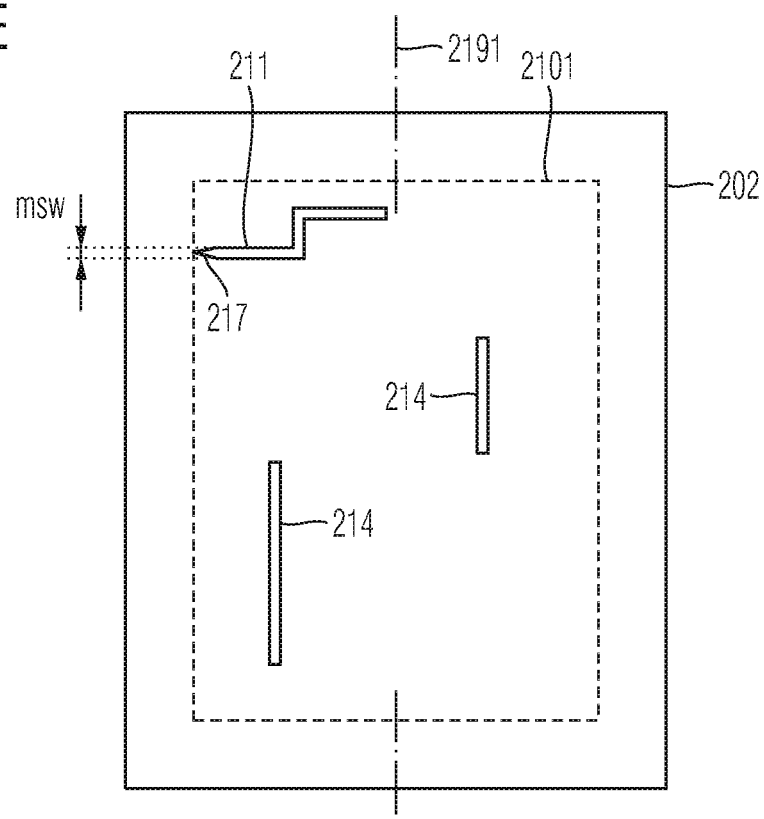
FIG. 5E is a schematic plan view of a first reticle of a set of two complementary reticles according to an embodiment referring to cross-exposure field chip patterns.
Figure 5F:
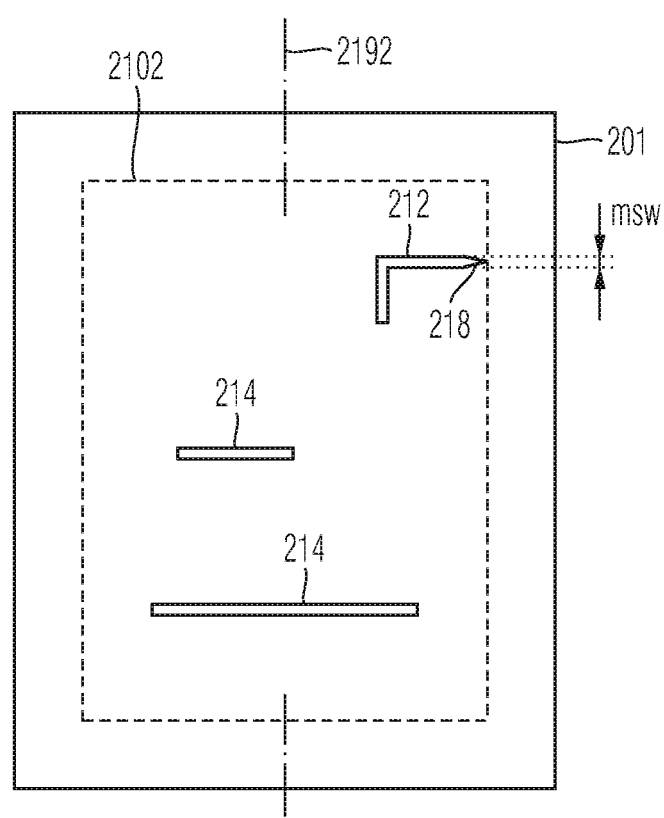
FIG. 5F is a schematic plan view of a second reticle complementary to the first reticle of FIG. 5E.

FIGS. 5E and 5F show a set of complementary first and second reticles 201, 202 for forming a chip pattern for a semiconductor device which is larger than an exposure field and which includes stripe structures crossing exposure field boundaries, wherein first and second line patterns 211, 212 for overlapping projections are formed on two different, complementary reticles 201, 202.

According to FIG. 5E a first pattern section 2101 of a reticle pattern 210 is formed on the first reticle 201 and includes at least the first line pattern 211 at a first side. The first pattern section 2101 may include further transparent regions 214 defining chip structures in a first region of a semiconductor device.

FIG. 5F shows a second pattern section 2102 of the reticle pattern 210 formed on the second reticle 202. The second pattern section 2102 includes at least the second line pattern 212 at a second side opposite to the first side. The first and second line patterns 211, 212 match, e.g., may be symmetric with respect to parallel horizontal center axes 2191, 2192 of the first and second pattern sections 2101, 2102. In other words, a reflection of an end section 217 of the first line pattern 211 at a horizontal center axis 2191 of the first pattern section 2101 overlaps a virtual position-invariant translation of the second line pattern 212 into the first pattern section 2101, wherein the position-invariant translation virtually images the second line pattern 212 into the first pattern section 2101 at the same position it actually has in the second pattern section 2102. The second reticle 202 may include further transparent regions 214 defining further chip structures in a second region of the semiconductor device.

The first and second line patterns 211, 212 may be portions of non-similar stripe structures and may extend in a horizontal direction orthogonal to equivalent edges of the reticle patterns 210. The first and second line patterns 211, 212 may have the same line pattern width msw or at least approximately the same line pattern width msw and match, e.g., may be arranged symmetrically with respect to the corresponding horizontal center axes 2191, 2192 orthogonal to the longitudinal axis of the first and second line patterns 211, 212.

Neighboring exposure fields are exposed alternatingly with the first reticle 201 and the second reticle 202. The first and second reticles 201, 202 may be exchanged with each other, e.g., successively after each exposure or only once after a first run has exposed each odd exposure field with the first reticle. The method facilitates large-scale chip patterns with a chip area larger than a single exposure field, wherein stripe-shaped cross-exposure field patterns can be realized both at low width variations and at low costs.

Figure 5G:
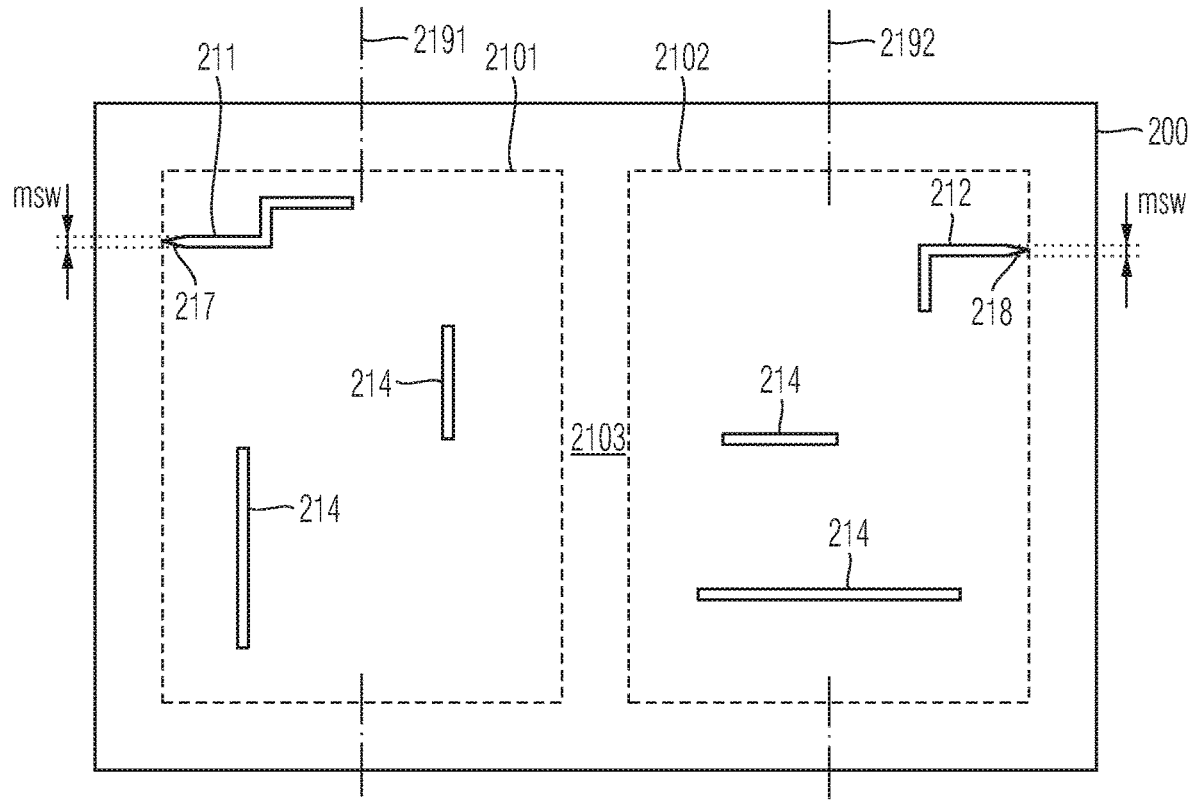
FIG. 5G is a schematic plan view of a reticle including a set of two complementary pattern sections according to another embodiment concerning cross-exposure field chip patterns.

FIG. 5G shows a reticle 200 that includes a set of two complementary pattern sections 2101, 2102 for forming a chip pattern for a semiconductor device which active area is larger than a single exposure field and which includes stripe structures crossing exposure field boundaries. The first line pattern 211 is formed in a first pattern section 2101 and the second line pattern 212 is formed in a second pattern section 2102 on the same reticle 200. A non-imaging section 2103 separates the first and second pattern sections 2101, 2102 from each other. After exposure of a substrate with the first pattern section 2101, a reticle stage shifts the reticle 200 for exposure with the second pattern section 2102.

According to other embodiments, the reticle stage may rotate the reticle 200 after exposure with the first pattern section 2101, wherein on the reticle 200 the pattern in the second pattern section 2102 is rotated with respect to the first pattern section 2101 by, e.g., 180°.

Figure 5H:
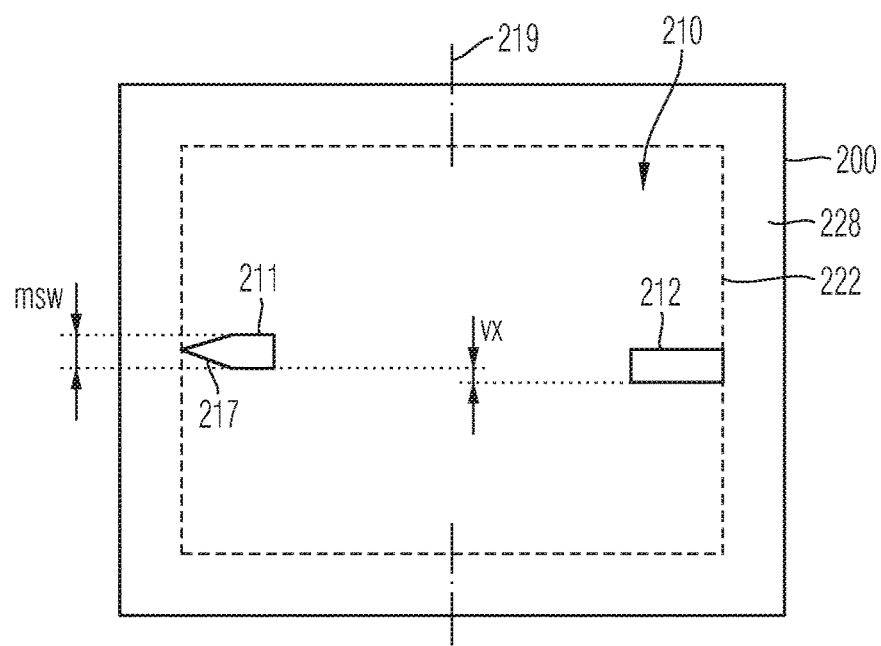
FIG. 5H is a schematic plan view of a reticle according to an embodiment with only one of two overlapping line patterns including an end section in which the amount of light passing through the line patterns decreases outwards.

FIG. 5H shows a reticle pattern 210 with asymmetric but nevertheless "matching" first and second line patterns 211, 212 in the sense defined above.

The reticle pattern 210 is formed in a pattern area 222 and includes a first line pattern 211 with an end section 217 at an edge of the reticle pattern 210, wherein light flux through the end section 217 decreases with increasing distance to a horizontal center axis 219 of the reticle pattern 210. A second line pattern 212 is formed on the opposite edge, wherein a reflection of the end section 217 of the first line pattern 211 at the horizontal center axis 219 is shifted with respect to the second line pattern 212 by a displacement vx. The displacement vx is sufficiently small such that the reflection of the first line pattern 211 at the horizontal center axis 219 overlaps the second line pattern 212 along a direction parallel to the horizontal center axis 219 by at least 50% of a line pattern width of the narrower one of the first and second line patterns 211, 212.

Figure 6A:
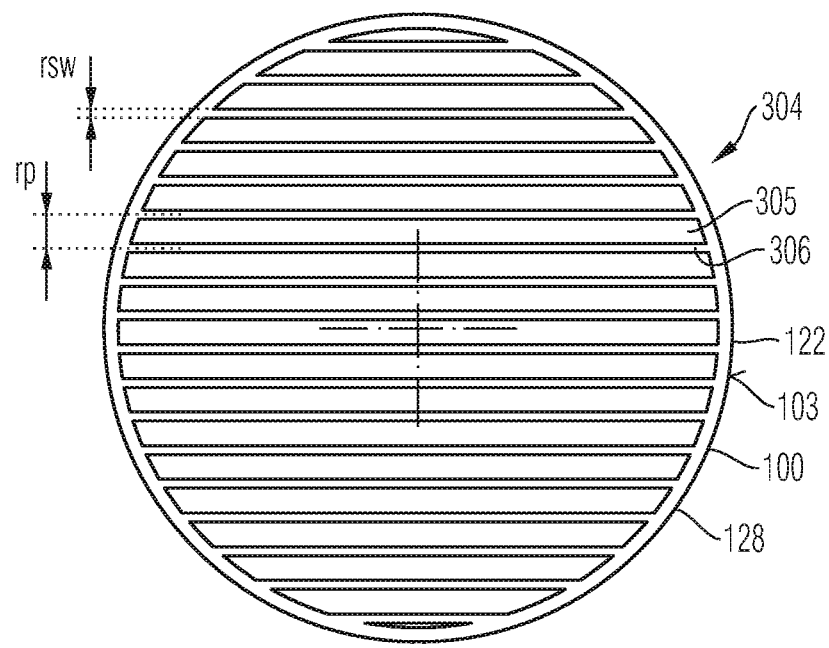
FIG. 6A is a schematic plan view of a semiconductor wafer according to an embodiment concerning a regular cross-exposure field stripe pattern.
Figure 6B:
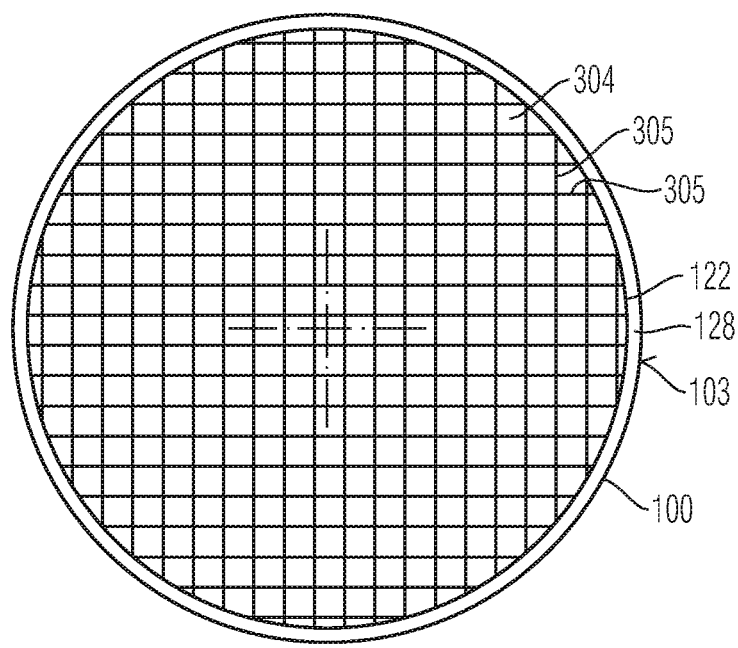
FIG. 6B is a schematic plan view of a semiconductor wafer according to an embodiment concerning a regular cross-exposure field grid pattern.

FIGS. 6A and 6B show resist masks 304 formed on a surface of a substrate 100 by using the reticles 200 of FIGS. 5C and 5D. The substrate 100 may be a semiconductor wafer, e.g., a silicon wafer suitable for the formation of power semiconductor devices. A diameter of the substrate 100 may be at least 100 mm, e.g., 200 mm or 300 mm.

In FIG. 6A the resist mask 304 includes a plurality of equally spaced stripe-shaped resist openings 305 and resist fins 306 extending across at least a usable area 122 of a process surface of the substrate 100, wherein an edge exclusion zone 128 with a width of several nanometers may separate the usable area 122 from a substrate edge 103. In the edge exclusion zone 128 the resist mask 304 may be absent or may include a continuous ring.

A mean resist stripe width rsw may be in a range from 20 nm to 300 nm, e.g., from 50 nm to 150 nm. A mean resist center-to-center distance rp may be in a range from 50 nm to 2 µm, e.g., from 100 nm to 1 µm.

The resist mask 304 is the result of multiple projections of the reticle 200 of FIG. 5C into neighboring exposure fields. A stripe width variation of the stripe-shaped resist openings 305 is in a range from 50% to 150%, e.g., from 80% to 120% of the mean resist stripe width rsw irrespective of an actual misalignment of the exposure fields in successive exposures provided that the misalignment is within a predefined stepping accuracy of at most ±50 nm, for example, at most ±20 nm.

The resist mask 304 of FIG. 6B may result from two exposure runs with the reticle of FIG. 5C, wherein after the first run, which results in the resist mask 304 of FIG. 6A, the substrate 100 is rotated against the reticle 200 by 90° in a horizontal plane. According to another embodiment the resist mask 304 of FIG. 6B may result from one single exposure run using the reticle 200 of FIG. 5D. In both cases, the stripe-shaped resist openings 305 form an orthogonal grid, wherein a stripe width variation of stripe-shaped resist openings 305 is in a range from 50% to 150%, e.g., from 80% to 120% of the mean resist stripe width, irrespective of an actual misalignment of the exposure fields in successive exposures, provided that the misalignment is within a predefined stepping accuracy.

The resist masks 304 of FIGS. 6A and 6B may be used, for example, for a grating test, wherein the resist mask 304 is visually inspected by an operator or by a suitable analyzing unit. Irregularities in the exposure process image into irregularities in the fine resist patterns of the resist masks 304, wherein comparatively small irregularities leave a comparatively strong visual foot print in the resist pattern. For example, any particle pinched between the substrate 100 and the wafer stage 840 of FIG. 2 leads to a local defocus that in turn results in a local widening or narrowing of resist lines. Irregularities in the fine resist pattern induced by local defocus leave a strong visual impression with a characteristic optical signature.

Irregularities induced into the resist pattern by misalignment of exposure fields render the background for the visual inspection less homogenous. The more regular the resist mask 304 is, the better visible and/or detectable are process irregularities. Forming the resist masks 304 of FIGS. 6A and 6B with the above-described exposure method facilitates the use of cost effective exposure apparatuses for highly sensitive grating tests.

The resist masks 304 may further be used as etch masks defining a dense pattern of grooves in a semiconductor substrate, wherein the grooves may be filled with insulator material such as silicon oxide to form a dense pattern of local silicon-on-insulator (SOI) regions. Semiconductor substrates with a plurality of local silicon-on-insulator (SOI) regions may replace conventional SOI wafers for the manufacturing of SOI devices.

FIGS. 7A to 7E concern embodiments of end sections 217 of transparent first line patterns 211 surrounded by an opaque mask area 215. Projections of the transparent first line patterns 211 onto a substrate overlap with the projections of symmetric second line patterns in successive exposures as described above. A line pattern width msw of the first line pattern 211 may be in a range from 20 nm to 4 µm, for example in a range from 50 nm to 1 m. A length LGEP of the end section 217 may be in a range from 20 nm to 4 µm, e.g., from 50 nm to 1 µm, by way of example.

Figure 7A:
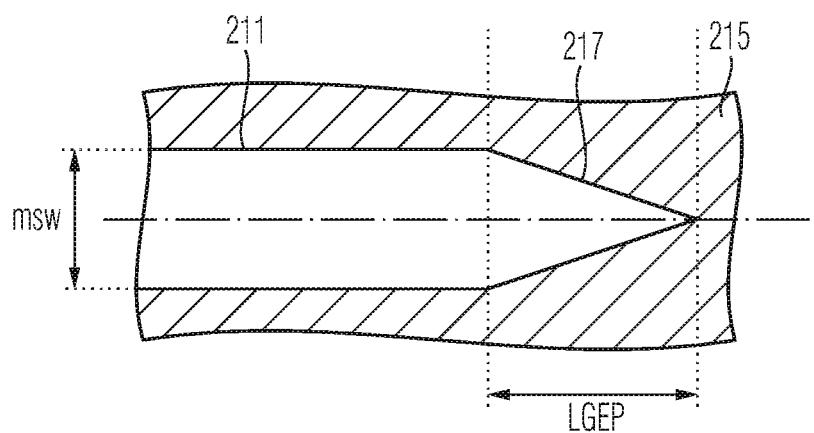
FIG. 7A is a schematic plan view of a portion of a reticle according to an embodiment concerning a line pattern with linearly tapering end section.

In FIG. 7A the end section 217 gradually tapers symmetrically with respect to a central longitudinal axis of the first line pattern 211. The length LGEP of the end section 217 may be in a range from 0.5*msw to 2*msw. The gradual taper may be linear as illustrated, concavely bowed, convexly bowed, or a sequence of bowed and linear sections.

Figure 7B:
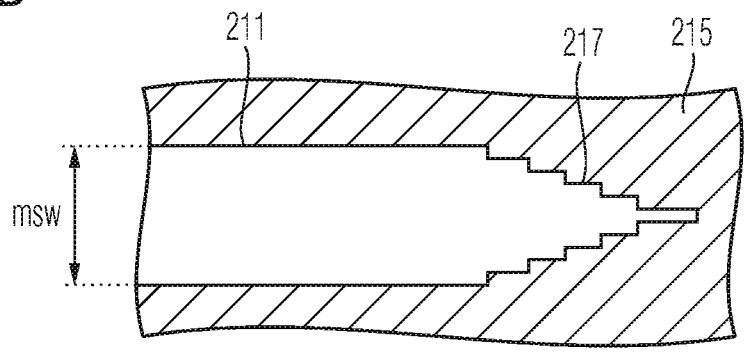
FIG. 7B is a schematic plan view of a portion of a reticle according to an embodiment concerning a line pattern with stepped end section.

In FIG. 7B the end section 217 tapers in steps and symmetrically with respect to a central longitudinal axis of the first line pattern 211.

Figure 7C:
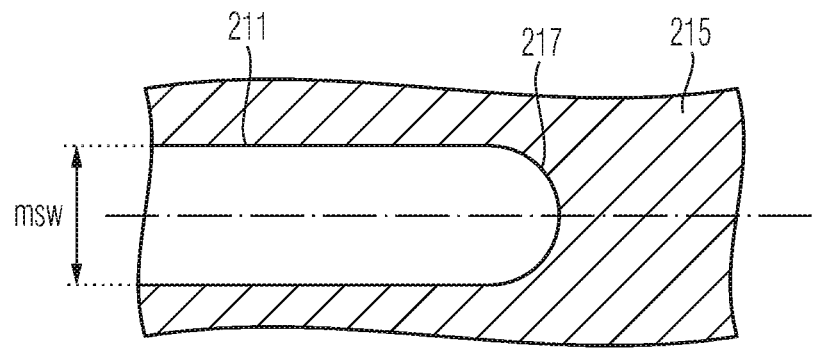
FIG. 7C is a schematic plan view of a portion of a reticle according to an embodiment concerning a line pattern with a semicircular end section.
Figure 7D:
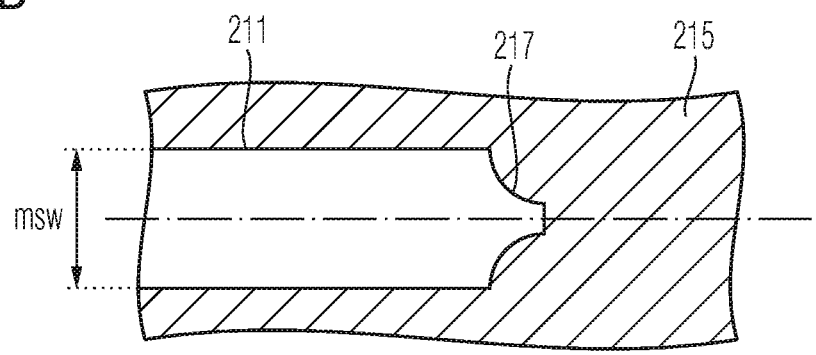
FIG. 7D is a schematic plan view of a portion of a reticle according to an embodiment concerning a line pattern that includes an end section with hollowed corners.

The first line pattern 211 in FIG. 7C includes a semicircular end section 217. In FIG. 7D the corners of the end section 217 are hollowed.

Figure 7E:
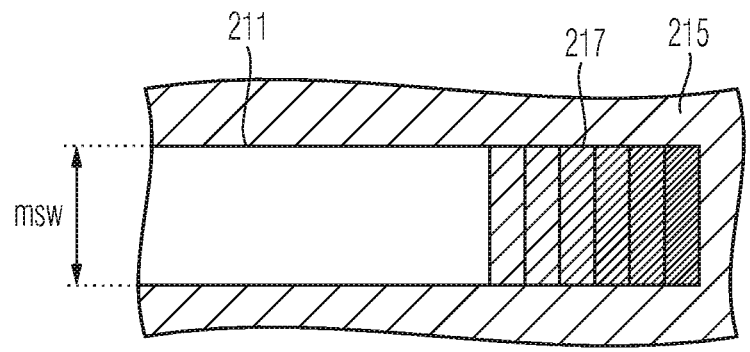
FIG. 7E is a schematic plan view of a portion of a reticle according to an embodiment concerning a line pattern with decreasing specific transmittance.

In the transparent first line pattern 211 of FIG. 7E transmission in the end section 217 is modulated by a change of transmittance. The transmittance may decrease with increasing distance to a horizontal center axis of the reticle in steps or gradually.

FIGS. 8A to 8D and 9A to 9D illustrate effects of the embodiments on the shape of resist lines at different alignment conditions by comparing the images of line patterns with and without such end sections through which light flux decreases with decreasing distance to a neighboring reticle edge, wherein FIGS. 8A to 8D refer to a comparative example without end sections and FIGS. 9A to 9D to an embodiment with end sections.

Figure 8A:
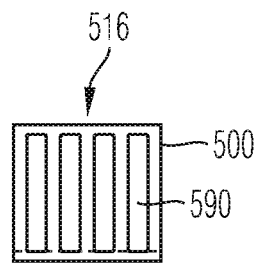
FIG. 8A shows a reticle according to a comparative example with line patterns without tapering end sections for discussing effects of the embodiments.

FIG. 8A shows a comparative reticle 500 with a comparative reticle pattern 510 including regularly arranged rectangular transparent line patterns 590 that do not include tapering end sections or sections with decreasing transmittance.

Figure 8B:
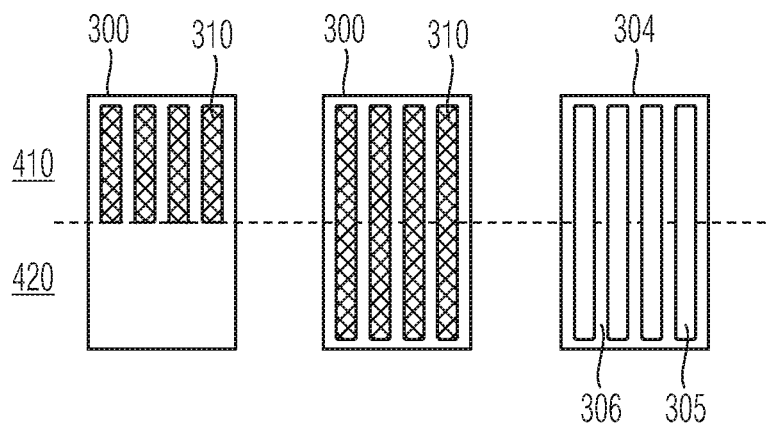
FIG. 8B shows a first latent image after exposure of a first exposure field, a second latent image after exposure of a second exposure field and a developed photoresist layer obtained by exposure with the reticle of FIG. 8A at perfect alignment between the first and second exposure fields for discussing effects of the embodiments.

The left-hand side of FIG. 8B shows the result of the exposure of the comparative reticle pattern 510 of FIG. 8A into a first exposure field 410 of a photoresist layer 300. The exposure activates the PAC in projection stripes 310 defined by the rectangular transparent line patterns 590.

The center of FIG. 8B shows the latent image after projecting the comparative reticle pattern 510 into a second exposure field 420 directly adjoining the first exposure field 410 in the projection of the longitudinal axis of the projection stripes 310 of the rectangular transparent line patterns 590, in case the second exposure field 420 is perfectly aligned to the first exposure field 410 without any overlap or gap between the first and second exposure fields 410, 420.

As shown on the right-hand side of FIG. 8B a resist mask 304 formed by developing the exposed photoresist layer 300 includes continuous, straight resist fins 306 and continuous, stripe-shaped resist openings 305 without any variation in width.

Figure 8C:
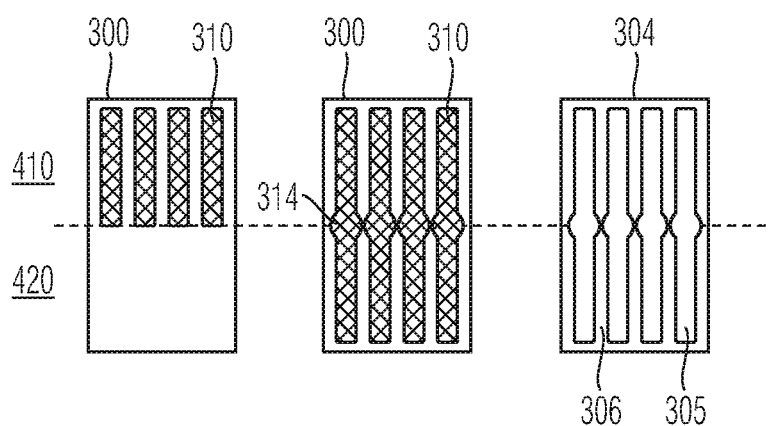
FIG. 8C shows a first latent image after exposure of a first exposure field, a second latent image after exposure of a second exposure field and a developed photoresist layer obtained by exposure with the reticle of FIG. 8A at a misalignment resulting in an overlap of the two exposure fields for discussing effects of the embodiments.

FIG. 8C refers to a projection of the comparative reticle pattern 510 into a second exposure field 420 closer to the first exposure field 410 than in FIG. 8B. The projection areas of the line patterns of two exposures overlap and form continuous projection stripes 310. The additional exposure dose in the overlapping region results in a latent image, in which the projection stripes 310 may include bulges 314 wherein the bulges 314 are significantly wider than portions of the projection stripes 310 outside the overlapping region.

As shown on the right-hand side of FIG. 8C the resulting resist fins 306 include significant constrictions, in which the width of the developed resist fins 306 deviates by more than 50% from the width outside the overlapping region.

Figure 8D:
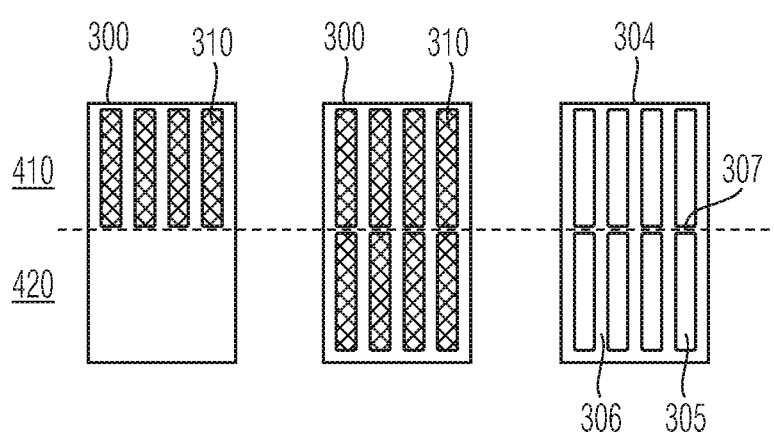
FIG. 8D shows a first latent image after exposure of a first exposure field, a second latent image after exposure of a second exposure field and a developed photoresist layer obtained by exposure with the reticle of FIG. 8A at a misalignment resulting in a gap between the two exposure fields for discussing effects of the embodiments.

In FIG. 8D a displacement of the second exposure field 420 with regard to the first exposure field 410 is greater than in FIG. 8B such that the projection areas in the first and second exposure fields 410, 420 leave a gap between them.

The resulting resist mask 304 includes additional resist ribs 307 interrupting the stripe-shaped resist openings 305.

Figure 9A:
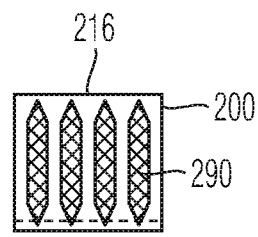
FIG. 9A shows a reticle including line patterns with tapering end sections according to an embodiment.

FIG. 9A shows a reticle 200 with a reticle pattern 210 including regularly arranged continuous, transparent straight stripes 290 including tapering end sections 217, 218.

Figure 9B:
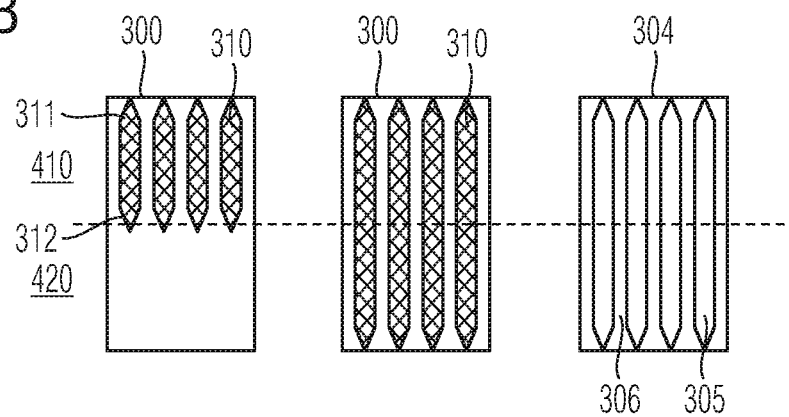
FIG. 9B shows a first latent image after exposure of a first exposure field, a second latent image after exposure of a second exposure field and a developed photoresist layer obtained by exposure with the reticle of FIG. 9A at perfect alignment between the first and second exposure fields.

The left-hand side of FIG. 9B shows a latent image of the exposure of the reticle pattern 210 of FIG. 9A into a first exposure field 410 of a photoresist layer 300. The latent image includes tapering stripe-shaped first and second projection areas 311, 312.

The center of FIG. 9B shows that in case the second exposure field 420 is perfectly aligned to the first exposure field 410, the latent image includes continuous, straight projection stripes 310 without significant width variations.

Accordingly, developing the exposed photoresist layer 300 forms a resist mask 304 that includes continuous, straight resist fins 306 and continuous, stripe-shaped resist openings 305 with no or only negligible width variations as shown on the right-hand side of FIG. 9B.

Figure 9C:
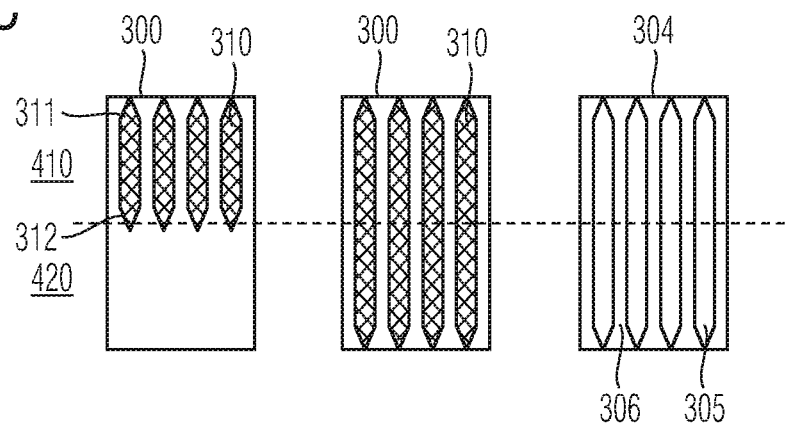
FIG. 9C shows a first latent image after exposure of a first exposure field, a second latent image after exposure of a second exposure field and a developed photoresist layer obtained by exposure with the reticle of FIG. 9A at a misalignment resulting in a large overlap of the two exposure fields.

FIG. 9C refers to a projection of the reticle pattern 210 into a second exposure field 420 closer to the first exposure field 410 than in FIG. 9B. The projection areas of two exposures overlap and form continuous projection stripes 310. Since in the complete overlapping zone at least one of the overlapping line patterns allows significantly less light to pass, the additional exposure dose is significantly reduced compared to the situation in FIG. 8C.

The right-hand side of FIG. 9C shows no or only negligible width variations for the resist fins 306 and for the stripe-shaped resist openings 305 after developing.

Figure 9D:
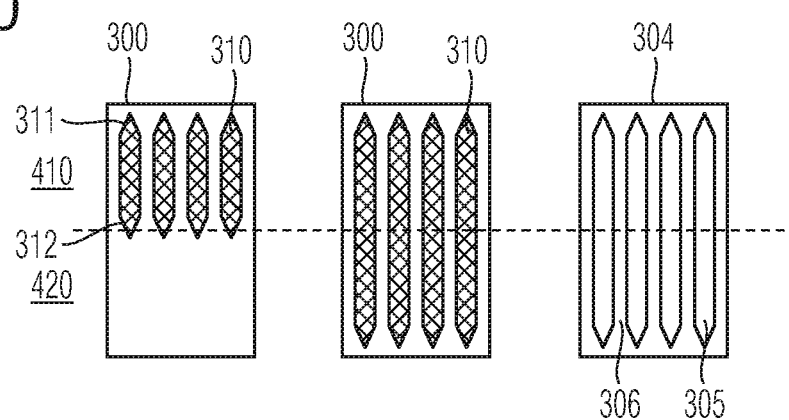
FIG. 9D shows a first latent image after exposure of a first exposure field, a second latent image after exposure of a second exposure field and a developed photoresist layer obtained by exposure with the reticle of FIG. 9A at a misalignment resulting in a small overlap between the two exposure fields.

In FIG. 9D the second exposure field 420 is imaged at a greater distance to the first exposure field 410 than in FIG. 9B. Due to the tapering end sections and the preset overlay, projection areas in the first and second exposure fields 410, 420 still overlap. Double exposure of the resist in the overlapping regions results in a resist mask 304 that includes continuous, stripe-shaped resist openings 305 crossing the exposure field boundary at low width variations.

The diagrams of FIGS. 10A to 11D plot the dose, which is effective in projections of line patterns for forming continuous cross-exposure field stripes. The dose is normalized to a dose effective in a central portion of the projections at a sufficient distance to the ends of the projections. The abscissa is scaled in terms of a distance $\Delta x$ from a center axis to which both exposure fields have the same distance.

FIGS. 10A to 10D refer to the comparative examples of FIGS. 8C and 8D, wherein the latent image in the photoresist layer results from transparent line patterns with an end face orthogonal to the longitudinal axis such that the horizontal cross-sectional area of the transparent line patterns is a rectangle and the line patterns do not include end sections with decreasing transmittance or decreasing width.

Figure 10A:
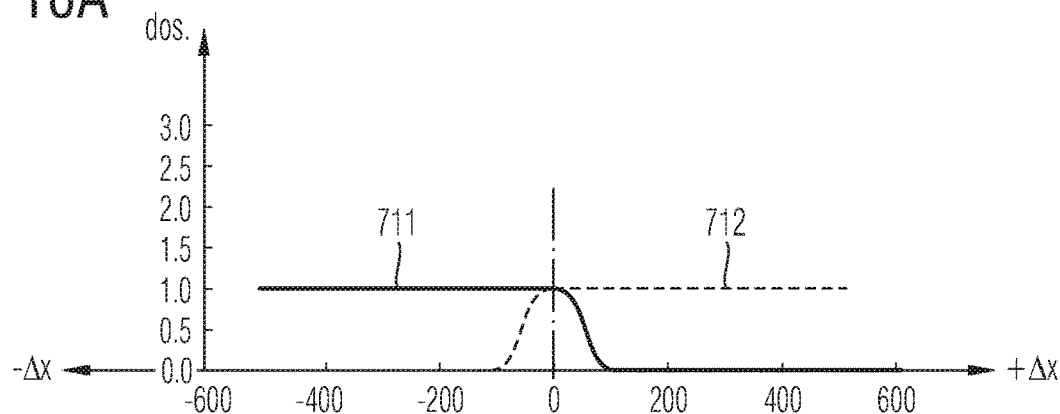
FIG. 10A is a schematic diagram illustrating an exposure dose distribution along a longitudinal axis of two overlapping projection areas of stub line patterns for each exposure to discuss effects of the embodiments.

In FIG. 10A the projections areas of the line patterns overlap by 50 nm along the longitudinal axis of the projection areas. After the first exposure the effective first exposure dose 711 is constant up to the end of the longitudinal axis of the projection area and then, in a tail portion, gradually decreases to zero within some ten nanometers. The same holds for the second exposure dose 712 resulting from the second exposure.

Figure 10B:
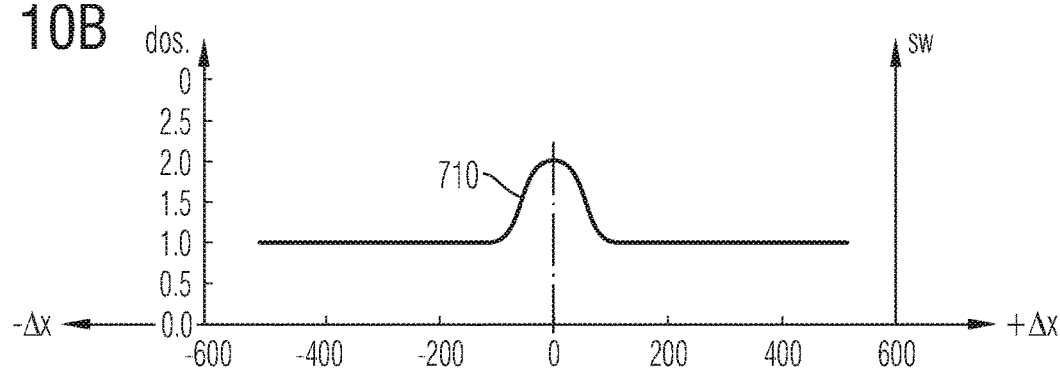
FIG. 10B is a schematic diagram illustrating the total exposure dose distribution along the longitudinal axis of the projection areas of the stub line patterns of FIG. 10A.

As illustrated in FIG. 10B the resulting total dose 710 reaches a value twice the mean value in the non-overlapping sections.

The exposure dose typically positively correlates with the line width provided that the exposure dose has sufficient distance to a saturation value of the PAC. The correlation may be approximately linear in a range of interest such that FIG. 10B approximates also the line width variation along the longitudinal axis of the cross-exposure field line feature. In the overlapping region the line width of a groove in a positive photoresist or the line width of a resist fin in a negative resist may reach twice the line width outside the overlapping region.

Figure 10C:
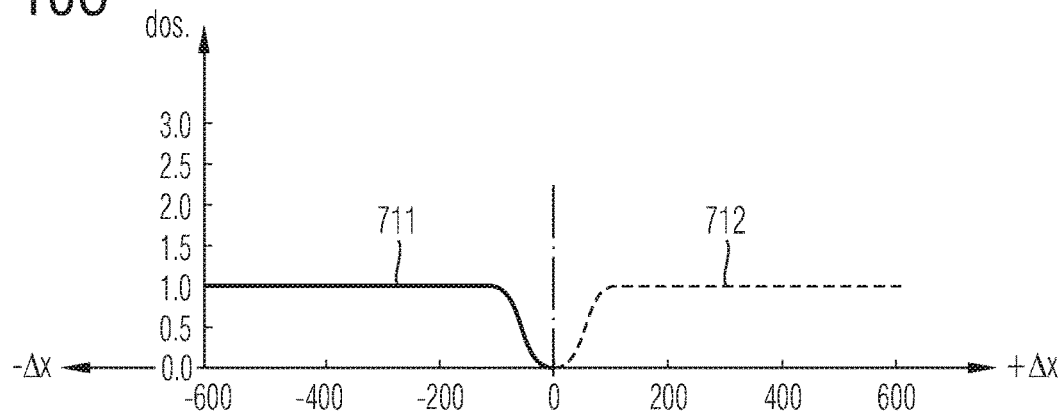
FIG. 10C is a schematic diagram illustrating an exposure dose distribution along a longitudinal axis of two spaced projection areas of stub line patterns for each exposure to discuss effects of the embodiments.
Figure 10D:
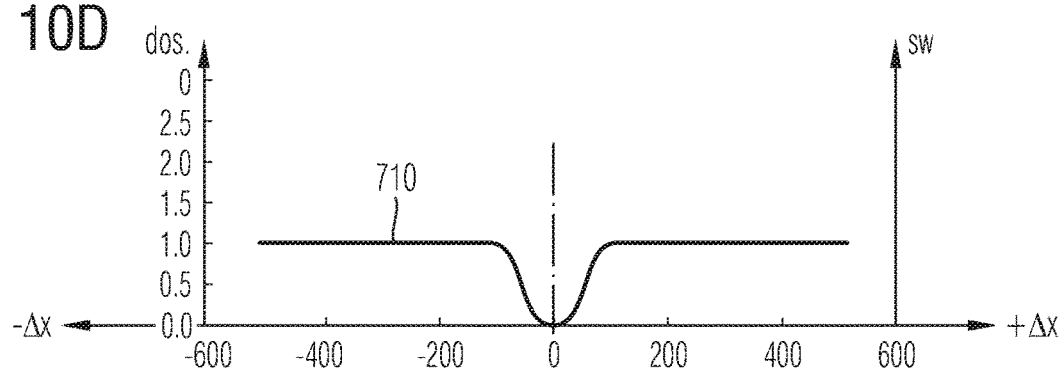
FIG. 10D is a schematic diagram illustrating the total exposure dose distribution along the longitudinal axis of the projection areas of the stub line patterns of FIG. 10C.

FIGS. 10C and 10D refer to the case that a misalignment between the two neighboring exposure fields results in that a distance between the projections of the concerned line patterns along the longitudinal axis is larger than the tail portion of the exposure dose along the longitudinal axis. The region receiving the first exposure dose 711 and the region receiving the second exposure dose 712 do not overlap such that a portion of the photoresist layer between the two projections remains unexposed and forms the resist ribs 307 of FIG. 8D.

FIGS. 11A to 11D show the same situation for line patterns, which end sections gradually taper at a rate of about 1:2, for example, by 50 nm across 100 nm length extension.

Figure 11A:
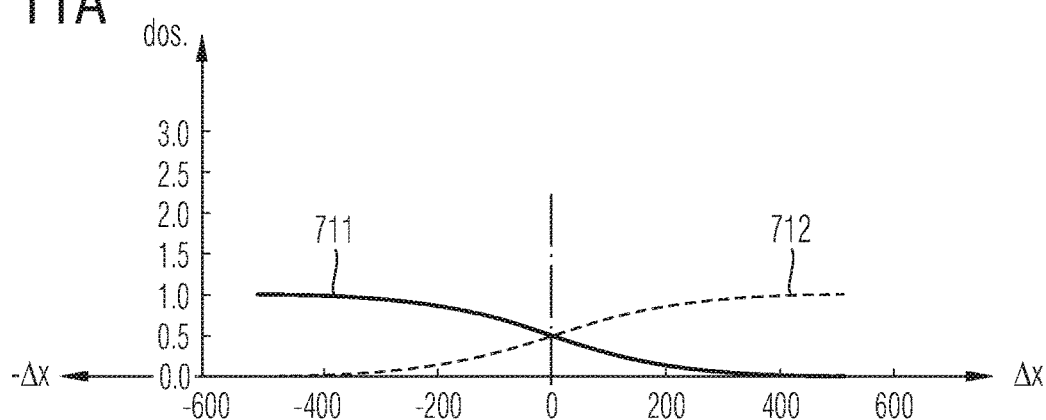
FIG. 11A is a schematic diagram illustrating, for each exposure, an exposure dose distribution along a longitudinal axis of two strongly overlapping projection areas of tapering line patterns according to an embodiment.

According to FIG. 11A the gradual decrease of exposure dose along the longitudinal axis results in a comparative long tail portion, which may be significantly longer than the maximum misalignment of two successively exposed exposure fields. The long exposure tails relax the requirements for alignment quality significantly.

Figure 11B:
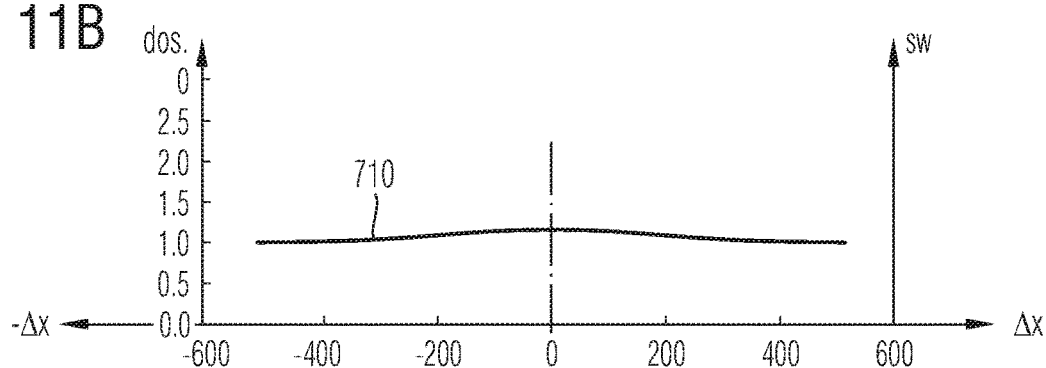
FIG. 11B is a schematic diagram illustrating the total exposure dose distribution along the longitudinal axis of the projection areas of the tapering line patterns of FIG. uA.

As illustrated in FIG. 11B the total exposure dose in the overlapping region is less than 120% of the total exposure dose outside the overlapping region.

Figure 11C:
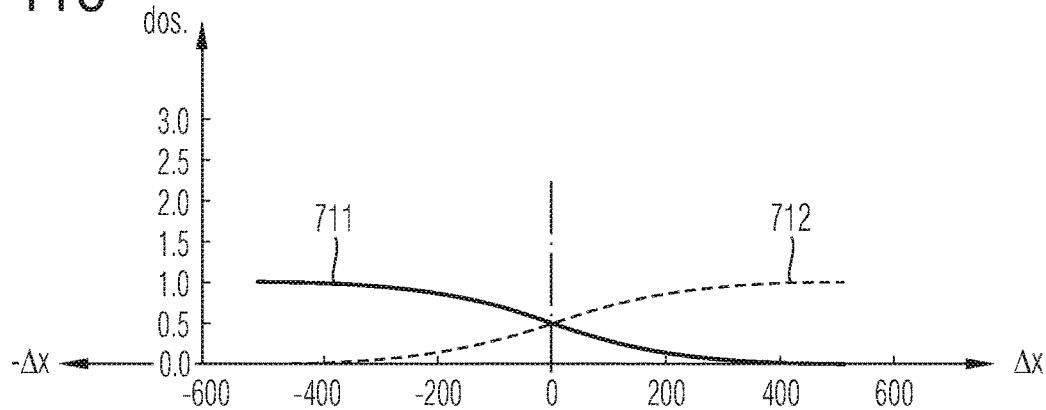
FIG. 11C is a schematic diagram illustrating, for each exposure, an exposure dose distribution along a longitudinal axis of two weakly overlapping projection areas of tapering line patterns according to the embodiment of FIG. 11A.
Figure 11D:
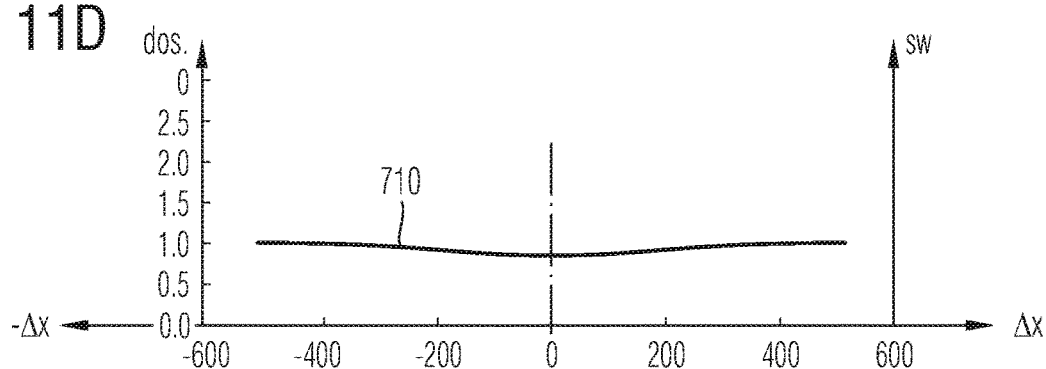
FIG. 11D is a schematic diagram illustrating the total exposure dose distribution along the longitudinal axis of the projection areas of the tapering line patterns of FIG. 11C.

As illustrated in FIGS. 11C and 11D in case of a largest displacement of the exposure fields in a direction away from each other within the stepping accuracy, the remaining minimum exposure dose is still at least 80% of the exposure dose in the central regions.

Figure 12A:
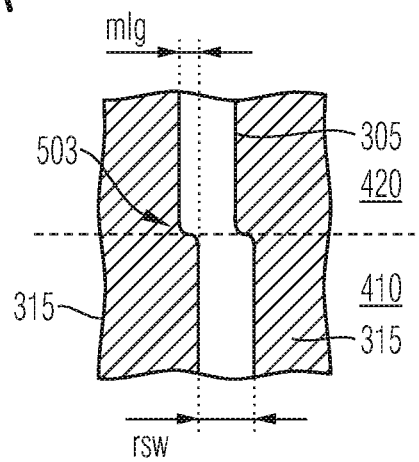
FIG. 12A is a schematic plan view of a portion of a substrate including a cross-exposure field stripe-shaped resist opening formed from stub line patterns at a lateral misalignment orthogonal to a longitudinal axis of the resist opening for discussing effects of the embodiments.

FIG. 12A shows the effect of a lateral misalignment of two neighboring exposure fields 410, 420 on a cross-exposure field, stripe-shaped resist opening 305 resulting from line patterns without tapering end sections. The stripe-shaped resist opening 305 is surrounded by a resist area 315 and includes a sharp bend 303 that results in a significant constriction of the cross-exposure field stripe structure by a distance equal to the current stepping misalignment mlg.

Figure 12B:
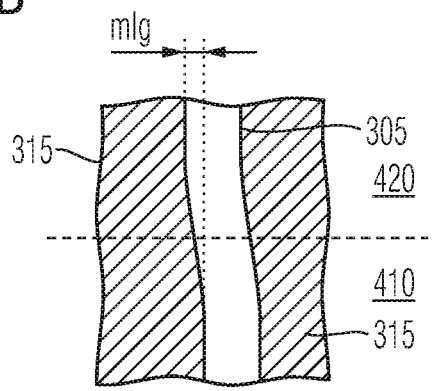
FIG. 12B is a schematic plan view of a portion of a substrate including a cross-exposure field stripe-shaped resist opening formed from tapering line patterns according to an embodiment at the lateral misalignment of FIG. 12A.

FIG. 12B illustrates the same situation for a cross-exposure field, stripe-shaped resist opening 305 resulting from tapering line patterns including end sections through which light flux decreases towards the tip. The tapering end sections form an extended transition zone in which the stripe-shaped resist opening 305 gradually compensates the lateral deviation induced by the current stepping misalignment mlg without any significant change in stripe width.

Figure 13:
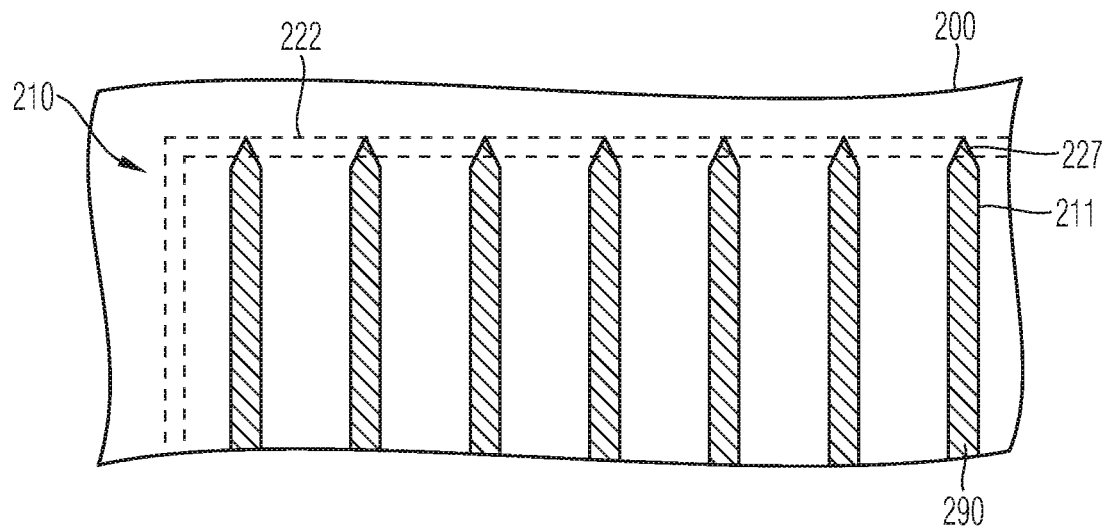
FIG. 13 is a schematic plan view of a portion of a reticle according to another embodiment concerning a cross-exposure field pattern including a plurality of regularly spaced transparent line patterns.

FIG. 13 shows a section of a reticle 200 for forming wafer-scale trench structures, e.g., etch stop structures including a dielectric material such as a silicon oxide. The etch stop structures form a pattern of regularly arranged straight lines extending across the complete usable area of a semiconductor wafer, from which a plurality of identical semiconductor dies are formed.

A reticle pattern 210 is formed within a pattern area 222. The reticle pattern 210 includes a plurality of equally spaced transparent straight stripes 290 extending from one side of the pattern area 222 to the opposite side, respectively. For a 1:1 projection unit a line pattern pitch msp may be in a range from 100 nm to 5 µm, e.g., form 200 nm to 5 µm.

The pattern area 222 may define the outline of the total exposure field. Line 227 visualizes the outline of an effective exposure field, which the exposure apparatus projects side-by-side onto a substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An exposure method, the method comprising:
projecting a reticle pattern into a first exposure field of a photoresist layer to form a first photoresist layer feature, wherein the reticle pattern is formed on a pattern surface of a transparent mask substrate and comprises first and second line patterns on opposite edges of the reticle pattern, and wherein at least the first line pattern comprises an end section through which light flux decreases outwards; and
projecting the reticle pattern into a second exposure field of the photoresist layer to form a second photoresist layer feature, wherein a first tapering projection zone of the end section of the first line pattern in the second exposure field overlaps an overlapping projection area of the second line pattern in the first exposure field, and wherein the first and second photoresist layer features form a continuous photoresist layer feature extending from the first exposure field through the overlapping projection area to the second exposure field.

2. The method of claim 1, wherein
the second line pattern comprises an end section through which light flux decreases and wherein the first tapering projection zone of the end section of the first line pattern in the second exposure field overlaps a second tapering projection zone of the end section of the second line pattern in the first exposure field.

3. The method of claim 1, wherein the first and second line patterns are sections of a continuous straight stripe.

4. The method of claim 1, wherein in the end sections a line pattern width decreases with increasing distance to a horizontal center axis of the reticle pattern.

5. The method of claim 1, wherein in the end sections a line pattern width steadily decreases with increasing distance to a horizontal center axis of the reticle pattern.

6. The method of claim 1, wherein in the end sections a line pattern width monotonically decreases with increasing distance to a horizontal center axis of the reticle pattern.

7. The method of claim 1, wherein the reticle pattern comprises a plurality of regularly spaced first line patterns and a plurality of regularly spaced second line patterns.

8. The method of claim 1, wherein the first line pattern is formed in a first pattern section on a reticle and the second line pattern is formed in a second pattern section of the reticle and wherein the first and second pattern sections are used in different exposures.

9. The method of claim 1, wherein the first line pattern is formed on a first reticle and the second line pattern is formed on a second reticle.

10. The method of claim 1, further comprising:
developing the exposed photoresist layer, wherein a continuous stripe-shaped resist opening is formed from a first projection area exposed by the first line pattern in the second exposure field and from the projection area of the second line pattern in the first exposure field, and wherein a width variation of the stripe-shaped resist opening is less than 50% of a maximum width of the stripe-shaped resist opening.

11. The method of claim 1, wherein the first line pattern comprises a stepped, semicircular, or hollow cornered end section that is symmetrical to the end section of the second line pattern.

* * * * *